(12) United States Patent
Ramos et al.

(10) Patent No.: US 7,799,611 B2
(45) Date of Patent: Sep. 21, 2010

(54) PARTIALLY PATTERNED LEAD FRAMES AND METHODS OF MAKING AND USING THE SAME IN SEMICONDUCTOR PACKAGING

(75) Inventors: Mary Jean Ramos, Alessandrea (SG); Romarico Santos San Antonio, Batam Island (ID); Anang Subagio, Batam Island (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 746 days.

(21) Appl. No.: 11/553,664

(22) Filed: Oct. 27, 2006

(65) Prior Publication Data

US 2007/0052076 A1    Mar. 8, 2007

Related U.S. Application Data

(63) Continuation-in-part of application No. 11/197,944, filed on Aug. 4, 2005, now Pat. No. 7,622,332, which is a continuation of application No. 10/916,093, filed on Aug. 10, 2004, now Pat. No. 7,129,116, which is a continuation of application No. 10/134,882, filed on Apr. 29, 2002, now Pat. No. 6,812,552.

(51) Int. Cl.
    H01L 21/00    (2006.01)
(52) U.S. Cl. .............. 438/112; 438/113; 438/123; 257/E21.502; 257/E21.513
(58) Field of Classification Search .............. 438/106, 438/123, 112, 113; 257/666–670
See application file for complete search history.

(56) References Cited

U.S. PATENT DOCUMENTS 4,038,488 A    7/1977    Lin

| 4,368,168 A | * | 1/1983 | Slepcevic | .............. 264/272.14 |
| 5,656,550 A | | 8/1997 | Tsuji et al. | |
| 5,703,407 A | | 12/1997 | Hori | |
| 5,767,574 A | | 6/1998 | Kim et al. | |

(Continued)

FOREIGN PATENT DOCUMENTS

EP    977251 A1    2/2000

(Continued)

OTHER PUBLICATIONS

International Preliminary Report on Patentability for PCT/US2007/082423, issued Apr. 28, 2009.

(Continued)

*Primary Examiner*—Evan Pert
(74) *Attorney, Agent, or Firm*—White & Case LLP

(57) ABSTRACT

A method of making a lead frame and a partially patterned lead frame package with near-chip scale packaging (CSP) lead-counts is disclosed, wherein the method lends itself to better automation of the manufacturing line as well as to improving the quality and reliability of the packages produced therefrom. This is accomplished by performing a major portion of the manufacturing process steps with a partially patterned strip of metal formed into a web-like lead frame on one side, in contrast with the conventional fully etched stencil-like lead frames, so that the web-like lead frame, which is solid and flat on the other side is also rigid mechanically and robust thermally to perform without distortion or deformation during the chip-attach and wire bond processes, both at the chip level and the package level. The bottom side of the metal lead frame is patterned to isolate the chip-pad and the wire bond contacts only after the front side, including the chip and wires, is hermetically sealed with an encapsulant. The resultant package being electrically isolated enables strip testing and reliable singulation without having to cut into any additional metal. The use of the instant partially patterned lead frame in making ELP, ELPF and ELGA-type CSPs is also disclosed.

33 Claims, 21 Drawing Sheets

U.S. PATENT DOCUMENTS

| | | | |
|---|---|---|---|
| 5,847,458 A | 12/1998 | Nakamura et al. |
| 5,896,651 A | 4/1999 | Hawthorne |
| 5,936,303 A | 8/1999 | Nishi |
| 6,001,671 A | 12/1999 | Fjelstad |
| 6,054,755 A | 4/2000 | Takamichi et al. |
| 6,093,584 A | 7/2000 | Fjelstad |
| 6,143,981 A | 11/2000 | Glenn |
| 6,232,650 B1 | 5/2001 | Fujisawa et al. |
| 6,238,952 B1 | 5/2001 | Lin |
| 6,291,274 B1 | 9/2001 | Oida et al. |
| 6,294,830 B1 | 9/2001 | Fjelstad |
| 6,316,727 B1 | 11/2001 | Liu |
| 6,348,399 B1 | 2/2002 | Lin |
| 6,355,199 B1 | 3/2002 | Briar et al. |
| 6,373,140 B1 | 4/2002 | Onodera et al. |
| 6,451,627 B1 | 9/2002 | Coffman |
| 6,498,099 B1 | 12/2002 | McLellan et al. |
| 6,534,849 B1 | 3/2003 | Gang |
| 6,545,364 B2 | 4/2003 | Sakamoto et al. |
| 6,576,539 B1 | 6/2003 | Lin |
| 6,585,905 B1 | 7/2003 | Fan et al. |
| 6,635,957 B2 | 10/2003 | Kwan et al. |
| 6,657,293 B1 | 12/2003 | Fumihira |
| 6,798,121 B2 | 9/2004 | Nakatani et al. |
| 6,821,821 B2 | 11/2004 | Fjelstad |
| 6,856,235 B2 | 2/2005 | Fjelstad |
| 6,872,661 B1 | 3/2005 | Kwan et al. |
| 6,906,423 B1 | 6/2005 | Asakawa et al. |
| 6,933,594 B2 | 8/2005 | McLellan et al. |
| 6,989,294 B1 | 1/2006 | McLellan et al. |
| 6,995,460 B1 | 2/2006 | McLellan et al. |
| 7,144,800 B2 | 12/2006 | Mostafazadeh et al. |
| 7,342,303 B1 | 3/2008 | Berry et al. |
| 7,451,539 B2 | 11/2008 | Morris et al. |
| 7,576,415 B2 | 8/2009 | Cha et al. |
| 2001/0020546 A1 | 9/2001 | Eldridge et al. |
| 2001/0045625 A1 | 11/2001 | Sakamoto et al. |
| 2001/0045640 A1 | 11/2001 | Oida et al. |
| 2001/0050370 A1 | 12/2001 | Sakamoto et al. |
| 2001/0052600 A1 | 12/2001 | Sakamoto et al. |
| 2002/0027010 A1 | 3/2002 | Glenn |
| 2002/0041019 A1 | 4/2002 | Gang |
| 2002/0053745 A1 | 5/2002 | Lin |
| 2002/0089053 A1 | 7/2002 | Liu et al. |
| 2002/0105069 A1 | 8/2002 | Kawahara et al. |
| 2002/0159242 A1 | 10/2002 | Nakatani et al. |
| 2003/0127711 A1 | 7/2003 | Kawai |
| 2003/0170922 A1 | 9/2003 | Sakamoto et al. |
| 2009/0230523 A1 | 9/2009 | Chien et al. |

FOREIGN PATENT DOCUMENTS

| | | | |
|---|---|---|---|
| EP | 1162669 | | 12/2001 |
| EP | 1189272 A | | 3/2002 |
| JP | 61-237458 | * | 10/1986 |
| JP | 11-150213 | * | 6/1999 |
| JP | 11-186294 | | 7/1999 |
| JP | 11-195742 A | | 10/1999 |
| JP | 2000-150760 | | 5/2000 |
| JP | 2000-188309 | | 7/2000 |
| JP | 2001-127199 | | 5/2001 |
| JP | 2002-76245 | | 3/2002 |
| JP | 2002-76246 | | 3/2002 |
| KR | 2001-0008926 | | 2/2001 |
| TW | 464053 | | 11/2001 |
| WO | WO-03-103038 A1 | | 12/2003 |
| WO | WO-2004-064144 A2 | | 7/2004 |
| WO | WO-2004-030030 A2 | | 8/2004 |
| WO | WO-2008-057770 | | 5/2008 |

OTHER PUBLICATIONS

International Search Report for PCT/IB03/04632, mailed Mar. 25, 2004.
Written Opinion for PCT/IB03/04632, mailed Jun. 23, 2004.
International Preliminary Examination Report for PCT/IB03/04632, completed Dec. 15, 2004.
International Search Report for PCT/US03/13046, mailed Sep. 23, 2003.
Written Opinion for PCT/US03/13046, mailed Feb. 25, 2004.
International Preliminary Examination Report for PCT/US03/13046, completed May 27, 2004.
International Search Report for PCT/GB04/00123, mailed Sep. 30, 2004.
Written Opinion for PCT/GB04/00123, mailed Sep. 30, 2004.
International Preliminary Examination Report for PCT/GB04/00123, completed Jan. 20, 2005.
"Surface Finishing for Lead Free", by George Milad, Uyemura International Corp., Southington, Connecticut, http://www.uyemura.com/library-4.htm.
"Immersion tin: Its chemistry, metallurgy, and application in electronic packaging technology", by Kovac et al., IBM J. Res. Develop., vol. 28, No. 6 (Nov. 1984), 726 (Abstract).
International Search Report dated Apr. 22, 2008 cited in International Application No. PCT/US2007/082423.
Written Opinion dated Apr. 22, 2008 cited in International Application No. PCT/US2007/082423.

* cited by examiner

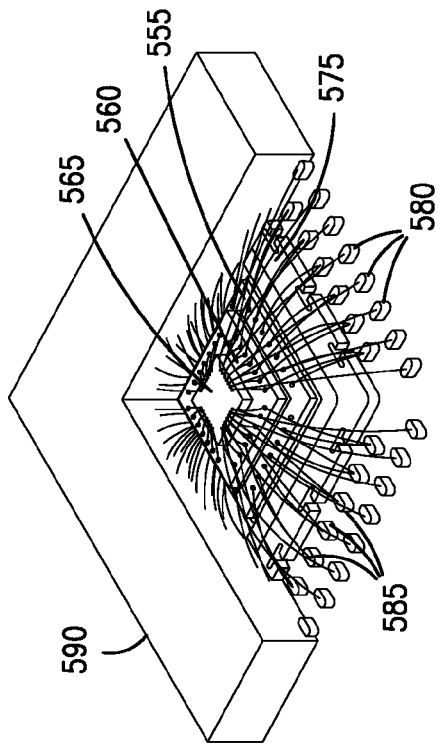
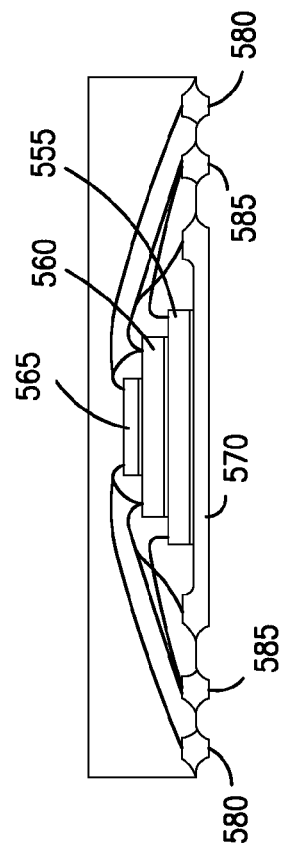
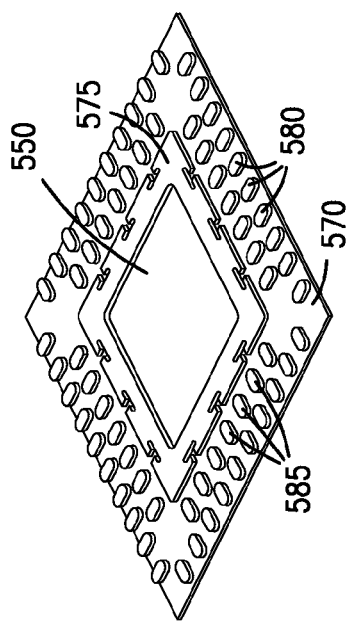
FIG. 27B
FIG. 27C
FIG. 27A

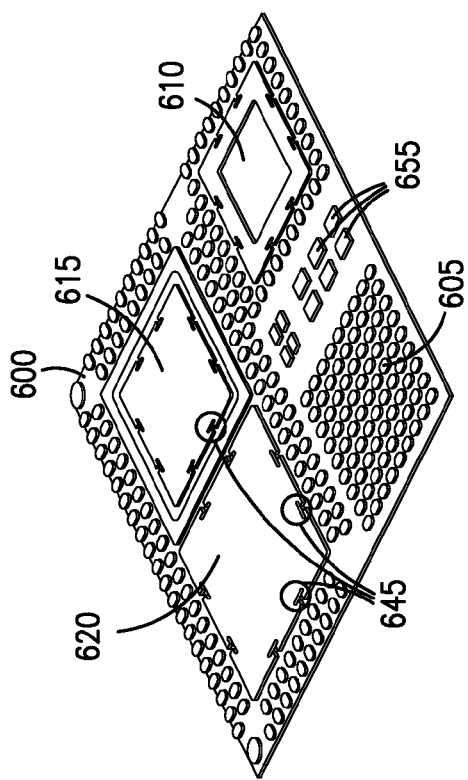
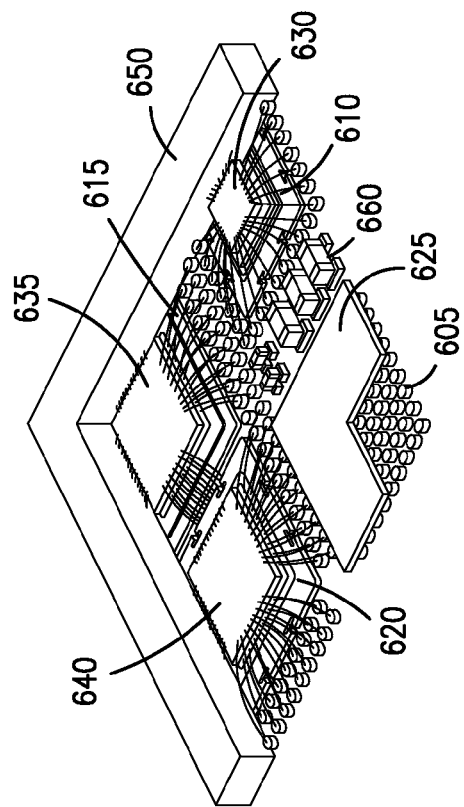
FIG. 28A
FIG. 28B

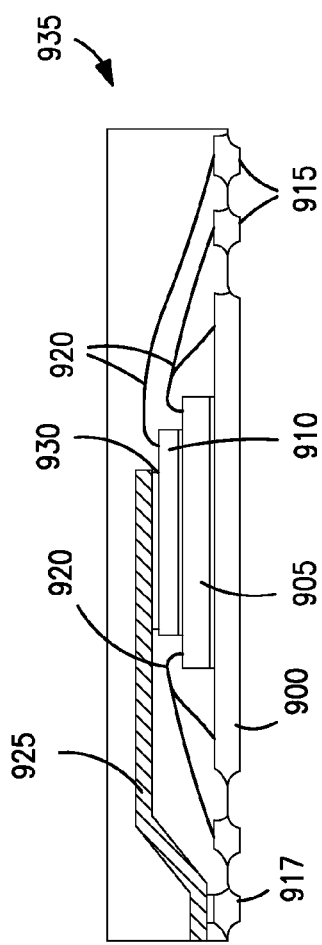
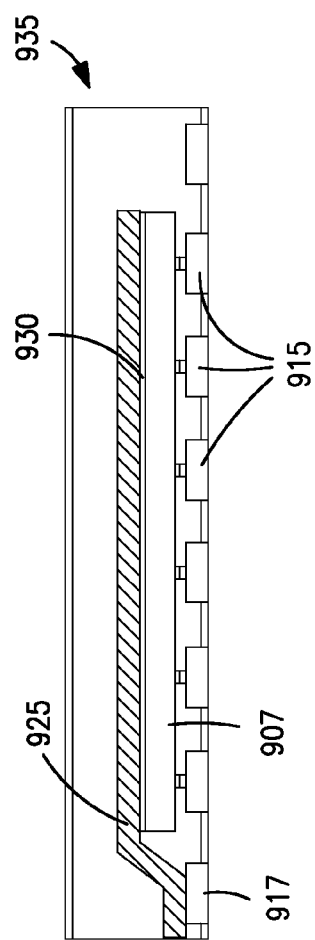

PARTIALLY PATTERNED LEAD FRAMES AND METHODS OF MAKING AND USING THE SAME IN SEMICONDUCTOR PACKAGING

This application is a continuation-in-part of both (a) application Ser. No. 11/197,944, filed Aug. 4, 2005 now U.S. Pat. No. 7,622,332, which is a continuation of application Ser. No. 10/916,093, filed Aug. 10, 2004 now U.S. Pat. No. 7,129,116; and (b) the aforementioned application Ser. No. 10/916,093. application Ser. No. 10/916,093 is a continuation of application Ser. No. 10/134,882, filed Apr. 29, 2002, now U.S. Pat. No. 6,812,552. All of these applications are incorporated herein by reference in their entirety.

FIELD OF THE INVENTION

The invention relates to electronic packaging in general, and more particularly, to a partially patterned lead frame and a method for making and using the same. The partially patterned lead frame is stronger and more stable than conventional lead frames. The sturdiness of the partially patterned lead frame improves the process of manufacturing lead frame packages and enhances the overall reliability of the end product. The lead frame also offers a high degree of flexibility for device integration and increased functionality.

BACKGROUND OF THE INVENTION

In making electronic packages that use lead frames, there are several process steps that subject the lead frames to mechanical and thermal stresses. The finer geometries of current lead frames and the ever-increasing integration of circuits on semiconductor chips have resulted in processing that places even greater stress on the lead frames. Finely configured lead frames often resemble very delicate embroidery, or stencil-like metal structures that tend to bend, break, disfigure and deform easily. (See FIGS. 1a and 1b). Such conventional lead frames are used in the industry to create a variety of chip packages, including wire bonded and flip-chip (FC) packages. (See FIGS. 2a-2d and 3a-3b).

Conventional lead frames generally lack structural rigidity. The finger-like portions of lead frames can be quite flimsy and difficult to hold in position. This leads to handling flaws, damage and distortion in assembly processes and complicated wire bonding situations. Consequently, bond parameters have to be optimized to compensate for lead frame bouncing during the bonding process. A failure to optimize the bonding parameters to compensate for the mechanical instability of the lead frame can result in poor bond adhesion, and hence poor quality and poor reliability of the bond.

The large metal plate portions of a typical lead frame extend from a central portion, known as the chip receiving area, also known as a chip-pad. The chip is usually attached to the receiving area with the backside down, and the front side is positioned face up with terminals located peripherally on the perimeter of the chip, or over the surface of the chip in the form of an array. The receiving area typically has dimensions of about 5 mm×5 mm, and the leads extending outwardly from the chip-pad area have typical dimensions of about 10 mm long×1 mm wide×0.2 mm thick. The lead frame is typically held down by a vacuum chuck and mechanical clamps. The chuck and clamps must be refitted for lead frames of different sizes and shapes. The present invention alleviates this problem.

The prior art has not shown any lead frames that can withstand the stresses encountered in current semiconductor packaging processes and that can be manufactures in a cost effective manner. The present invention achieves this objective by providing a partially patterned lead frame that not only improves the manufacturability of the lead frame itself, but also improves the integrity and reliability of the electronic packages that are formed therefrom. The present invention also addresses a continued need for increased device complexity, such as high I/O counts, multi-chip design, system in package, and flexibility on routing, that conventional lead frames are unable to offer.

SUMMARY OF THE INVENTION

One aspect of the invention provides for a method of forming electronic packages. The method comprises forming a block of partially etched lead frames having selectively pre-plated top and bottom surfaces. The lead frames comprise webbed portions and are separated from each other by street portions.

A first set of chips is attached to the chip pad areas on the lead frames. For convenience, the area of a lead frame which supports an integrated chip (IC), or to which an IC chip is affixed, will be referred to a chip pad area or a chip receiving area, whether this area is for wire-bonded chips, flip-chips, or any other kind of chips known in the art. These first set of chips may be back-bonded to chip receiving areas using an adhesive, resin, or other material which is compatible with both components. For example, the back-bonding may be accomplished using an epoxy resin, non-conductive epoxy, tape, or solder paste. Other suitable materials are known in the art.

A second set of chips is then die-stacked onto the tops of the corresponding first set of chips. After the second set of chips is die-stacked onto the tops of the first set of chips, one or more further sets of chips may be die-stacked onto the top of the second set of chip, thereby providing packages composed of two, three, or more chips stacked on top of each other. In certain embodiments of the invention, not all of the chips from the first set of chips may have chips die-stacked on top of them. In such embodiments, the lead frame will have one or more single (unstacked) chips and one or more sets of die-stacked chips.

Electrical connections are formed between the terminals of each of the first chips and the electrical lead portions of the corresponding lead frame. The electrical lead portions are electrically separated from the chip pad area. Electrical connections are also formed to the second or additional set of chips. The electrical connections may be formed all at the same time after the chips have been die-stacked on the lead frame. Alternatively, the first set of chips may be attached and electrically connected to the lead frames, and subsequently the second or additional sets of chips may be die-stacked to the tops of the first set of chips and electrically connected to the lead frame.

After the chips are die-stacked onto the lead frames and electrically connected to the lead frames, the lead frames are then encapsulated by applying an encapsulant material over the lead frames and the street portions separating the lead frames. After encapsulation, the bottom surface of the lead frames is back-patterned to remove webbed portions and the street portions. Back-patterning can be performed by any convenient method, such as by etching.

If a pre-plating material is applied to the bottom of the lead frame, for example, functioning as a photoresist, this pre-plating material may be removed after back-patterning.

Isolated patterns can be formed on the bottom of the lead frames after back-patterning. These isolated patterns can be plated or coated with a material to protect its surface. Examples of suitable materials include electroless Ni/immersion Au, immersion Sn, an organic surface protectant (OSP), and other solderable materials. This finishing or plating step facilitates provides additional stability to the back surface of the chip package and can allow for improved connectivity to the computer board, socket, or other location where the chip package is placed.

The encapsulant material disposed over the street portions is singulated to form individual chip scale packages for use in various applications in the semiconductor industry. Singulation may be accomplished using any convenient means available for separating the individual chip packages. In one embodiment, singulation may be performed by slicing the encapsulant using a saw or abrasive water jet.

Another aspect of the present invention provides for a lead frame comprising a chip pad area and leads and having alterations. Alterations may be considered as elements located on structural features of the lead frame which provide for an increased surface area when compared to lead frames which do not have alterations. The alterations facilitate retention of an encapsulant material which is applied over the lead frames prior to singulation. The alterations may be of any form, such as notches on the electrical leads of the lead frame.

Each of the second set of chips may be the same size or a different size as the corresponding first chip. In addition, the first set of chips attached to the lead frames do not need to be all identical, and thus these first set of chips may include larger and smaller chips. Typically, the largest chip will be attached to the chip pad area and increasingly smaller chips will be die-stacked on top of this chip. In alternative embodiments, the largest chip will not be attached to the chip pad area but will be in the middle or on top of the die-stack chips. The die-stacked chips may also all be the same size.

The second and additional set of chips may be stacked and bonded to corresponding first chips using any convenient means known in the art to bond chips to one another. For example, the chips may be stacked using a non-conductive epoxy or an insulating material such as a tape to prevent interference or electrical movement between or among the chips. In another embodiment, the second set of chips may be affixed to corresponding first chips using a tape, conductive adhesive or a conductive epoxy.

The first set of chips is electrically connected to the lead frame using known techniques. For example, the chips can be connected to the lead frame using wire-bonding techniques or using flip-chip technology.

The set of first chips may be electrically connected to the lead frame before the second set of chips are die-stacked onto the first chip. Alternatively, the first set of chips may be electrically connected to the lead frame after the second or additional set of chips are die-stacked onto the corresponding first set of chips. The step of forming electrical connections may be accomplished by connecting the terminals on the chip to the end portions of the electrical leads extending to the chip area. The electrical connections may be formed using any convenient or appropriate technique. For example, if the chips are wire-bonded chips, the connections can be formed using wire-bonding techniques such as thermasonic bonding. Flip-chips will generally be electrically connected to the lead frame using flip-chip techniques. Combinations of wire-bonding and flip-chip techniques are also within the scope of the invention. When flip-chips are attached directly to the lead frame, the corresponding leads may be plated or unplated.

The second set of chip receives power to perform calculations or other functions. This second set of chips may be electrically connected to corresponding first chips, to the lead frame, or to both. The connections which are made between the various chips and the lead frame will depend upon the specific situation at hand and particular electronic package formed.

The type of chips used in the invention will also depend upon the specific circumstances. For example, the chips may be wire-bonded chips, flip-chips, or any other kind of chips which are suitable for use in electronic chip packages. In one embodiment, the first set of chips comprises flip-chips or wire-bonded chips or both, and the second and any subsequent sets of chips comprise wire-bonded chips. Any of the chips may also comprise a semiconductor device.

The electronic packages formed by the die-stacked chips in accordance with the invention will have a particular height after encapsulation and singulation. In order to reduce the height of the electronic packages, the chip pad area may be recessed to reduce the height of the obtained package. That is, the chip pad on the lead frame area may be formed with a lowered interior so as to allow chips to fit inside this area and thereby provide chips with a lowered height.

The electronic packages formed according to the disclosed method are strong and stable. To provide for further reliability of the package during stress conditions and manufacturing, alterations may be used to increase the retention of the encapsulant. The alterations may be located along the periphery of the chip pad, leads, or both.

Selective pre-plating of the bottom lead frame may be used to define the bottom features of the lead frame. This selective pre-plating may provide a similar pattern on both top and bottom surfaces of the lead frame. The selective pre-plating may be accomplished using any convenient materials. In one embodiment, a NiPdAu or silver alloy is used to pre-plate the lead frame.

After encapsulation, the die-stacked chips will be surrounded by a solid encapsulant to prevent movement or weakening of the electrical connections between the chips and the lead frame. The entire set of stacked chips may be covered by an encapsulant. Alternatively, a portion of the topmost chip, such as a back or top surface, may remain exposed after encapsulation. For example, the surface of the topmost chip may be exposed through the encapsulant and the remaining portion of the chip embedded in the encapsulant. In this manner, the amount of encapsulant may be reduced without dramatically affecting the stability of the final package. In addition, if the top or back surface of the top-most chip contains identifying information, the package can be formed such that this information is not covered by the encapsulant and is readily viewable by the user.

As previously stated, the chips and die-stacked chips are electrically attached to the lead frame in order to provide power to the chips. In addition to chips such as flip-chips or wire-bonded chips, other elements may be connected to the lead frame. These additional elements may be structural elements which provide an increased support or stability to the package. The additional elements may also be electrical elements which support the functions of the chips or the chip packages. Examples of such additional elements are passive components, isolated pads, power rings, ground rings, and routings. Any combination of these and other structural or electrical elements in the chip package is within the scope of the present invention.

The encapsulant material may be any kind of substance which can be applied to the die-stacked chips and which solidifies to form a durable solid. In one embodiment, the encapsulant may be a liquid resin which surrounds the chips and hardens to yield the chips. An example of an encapsulant is an epoxy resin. The encapsulant will normally be a nonconducting substance to prevent electrical signals inside the encapsulated material from crossing from one chip to another.

When the additional elements comprise electrical elements, these elements may be electrically connected directly or indirectly to the lead frame. These additional elements may also be electrically connected to one or more chips in the package, and such embodiments will depend upon the specific chip scale package being formed.

The lead frames may be formed using production techniques known in the art. For example, the lead frames may be formed using chemical etching, stamping, or coining techniques.

The lead frames may be coated or partly coated with a film of a material, such as an electrical conducting material. The film can provide for an increased electrical throughput between the lead frame and the chips which are attached to the lead frame compared to a lead frame without such a film. In one embodiment, the film is formed from copper or a copper alloy. The thickness of the film is generally not critical, although the film will have to be sufficiently thick to have mechanical stability. In one embodiment, the thickness of the film is greater than or equal to about 0.05 mm.

Another aspect of the invention provides for a lead frame comprising a chip pad area and leads. The lead frame has alterations which provide for an increased retention of an encapsulant material covering the lead frame. Chips will usually be attached to the chip pad area and electrically connected to the leads.

The alterations may be structurally designed and configured to provide an increased surface area for retention of an encapsulant. The alterations may take any type of form which provides for an increased retention of the encapsulant. For example, the alterations may be in the shape of a cavity, depression, or notch which is located on the lead frame or on a portion of the lead frame. The alterations may also be present on the leads to which electrical connections to the chips are formed.

The alterations may be on any portion of the lead frames. For example, the alterations may be on the periphery of the chip pad area or on the leads, or on both. The alterations may also be in the form of a roughening of the periphery of the chip pad area, the lead, or both.

In addition to providing alterations for improved retention of the encapsulant, the surface of the lead frame may be roughened to provide for an increased surface area. The roughened surface will facilitate adhesion of the encapsulant to the surface of the lead frame.

A clip can optionally be used in place of wire bonding to increase the flow of power to the chip and thereby improve the performance of the chip.

It will be apparent from the above that the partially etched lead frame provides unity of structure and the attendant rigidity and strength to withstand the stress and strain of various manufacturing processes in the making of electronic packages. It is because of these unique mechanical properties that a partially etched lead frame package can also withstand connection to the next level of packaging, which previously has not been possible with conventional plastic packages.

BRIEF DESCRIPTION OF THE DRAWINGS

FIGS. 6b and 6c show progressively enlarged top views of the lead frames in the matrix shown in 6a.

FIGS. 27a-27c are perspective and cross-sectional views of an embodiment of the invention wherein the chip pad is recessed to allow for improved die stacking and for a reduction in the package height.

FIGS. 28a and 28b show perspective views of lead frames having a recessed chip pad area and die-stacked chips according to an embodiment of the present invention.

FIGS. 33a-33b illustrate an aspect of embodiment of the invention wherein a clip is used in place of wire bonding to improve the power capability of the chip.

DETAILED DESCRIPTION

The present invention will now be described with reference to the Figures, wherein like numeral refer to like elements. FIGS. 4-15b and FIGS. 16-24b show different embodiments of forming a partially patterned lead frame package with lead counts comparable to that of near-chip scale packages (CSPs). The method of the invention improves the automation of the manufacturing line and the quality and reliability of the packages made therefrom. This is accomplished by performing a major portion of the manufacturing process steps with a partially patterned metal film formed into a web-like lead frame on one side. In contrast with conventionally punched through stencil-like lead frames, the lead frame used in the invention is partially patterned on one side and is solid and flat on the other side. This construction is improved both mechanically and thermally, and performs without distortion or deformation during the chip-attach, wire bond, and encapsulation processes. After the chip attach and wire bonding process steps are completed and the chip and wire bonds are affixed and hermetically encapsulated in a molding material, the bottom surface is etched entirely through the film to isolate the lead contacts from the chip-pad and each other. Subsequently, the resultant encapsulated package is singulated without having to cut into any additional metal.

More specifically, FIGS. 4-15b show the forming of a partially patterned lead frame for a wire-bonded chip and a method of using the same for forming an ELP-type electronic package. FIGS. 16-22, on the other hand, show the forming of a partially patterned lead frame for a flip-chip and a method of using the same for forming an ELPF-type electronic package. A method of forming an ELGA-type of electronic package, using the instant partially patterned lead frame, is also described in connection with FIGS. 24a and 24b.

Figure 1A:
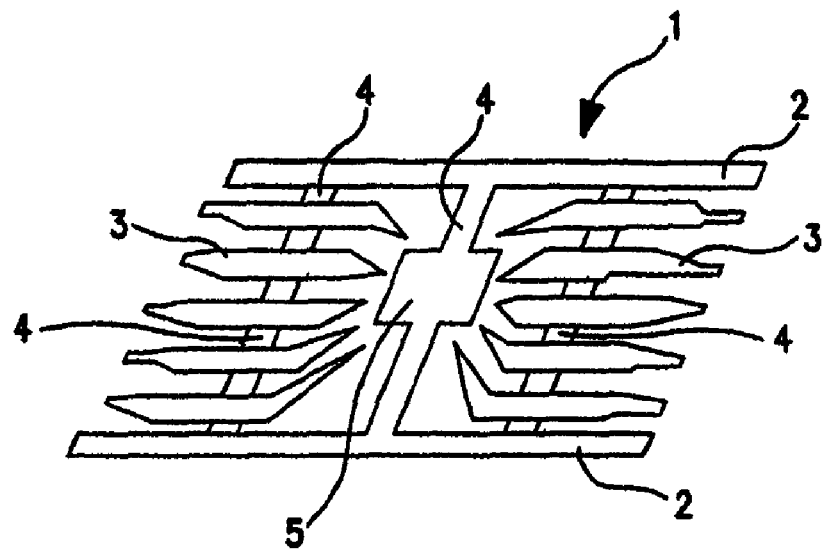
FIG. 1a is a diagram of a conventional lead frame with leads and a chip-pad area, according to prior art.
Figure 1B:
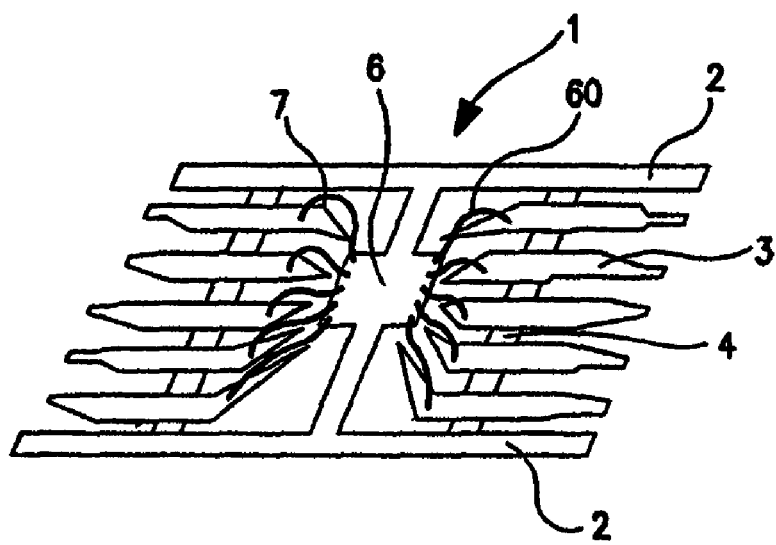
FIG. 1b is a diagram of the conventional lead frame of FIG. 1a showing the attachment of a chip to the chip-pad, and the wire bonding of the terminals on the chip to the leads, according to prior art.
Figure 2A:
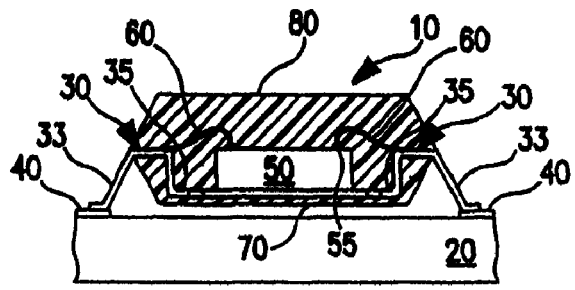
FIG. 2a is a cross-sectional view of a wire-bonded and leaded (with leads) near-chip scale package (CSP), showing connection to the next level of packaging by means of leads, according to prior art.
Figure 2D:
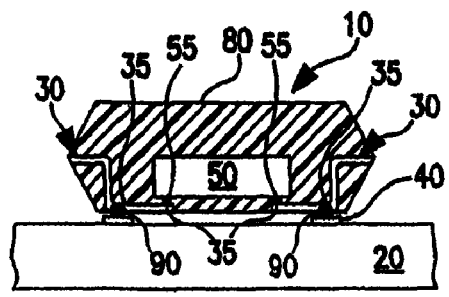
FIG. 2d is a cross-sectional view of a flip-chip and leadless near-CSP, showing connection to the next level of packaging by means of solder balls, according to prior art.
Figure 2B:
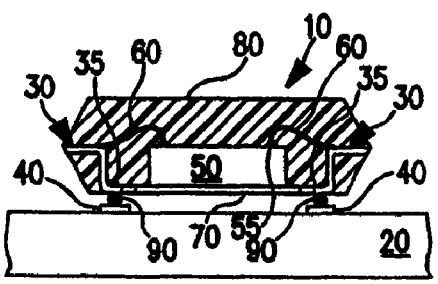
FIG. 2b is a cross-sectional view of a wire-bonded and leadless (with no leads) near-CSP, showing connection to the next level of packaging by means of solder bumps or balls, according to prior art.
Figure 3A:
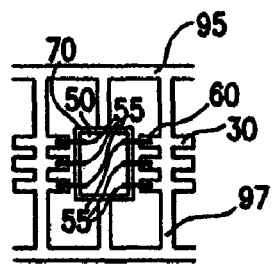
FIG. 3a is a top view of a stencil-like lead frame showing the wire-bonded connection of a back-bonded chip to the leads of the lead frame, according to prior art.
Figure 2C:
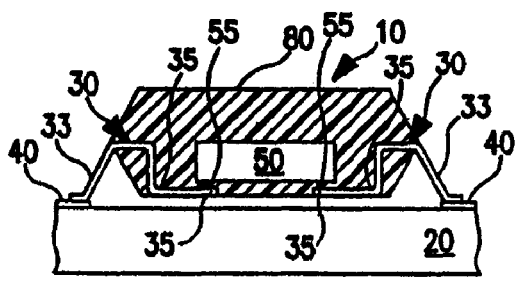
FIG. 2c is a cross-sectional view of a flip-chip and leaded near-CSP, showing connection to the next level of packaging by means of leads, according to prior art.
Figure 3B:
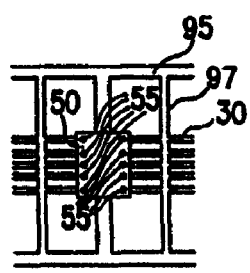
FIG. 3b is a top view of a stencil-like lead frame showing the connection of a flipped chip to the leads of the lead frame through a solder reflow process, according to prior art.
Figure 4:
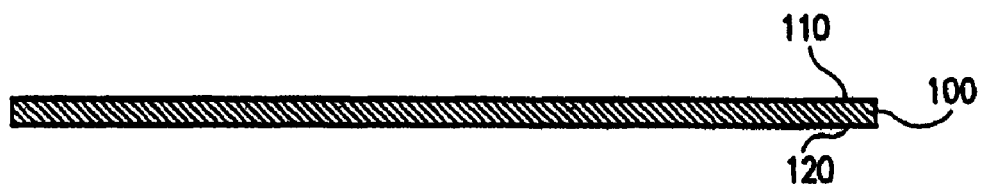
FIG. 4 is a cross-sectional view of a metal film of uniform thickness pre-plated on both sides with a bondable material, according to the present invention.

FIG. 4 is a cross-sectional view of a film, preferably a sheet of metal, preferably copper, that is not only to be formed into a lead frame, but also to serve as a stable carrier during the ensuing process steps of forming the lead frame. The thickness of the strip of metal is equal to or greater than about 0.05 mm. In another embodiment, the thickness can be in the range between about 0.05 to 0.5 mm.

Forming a lead frame typically involves cutting through the strip of metal, like cutting a stencil, and then working with very fine finger-like leads. In order to hold down such a delicate structure in place, a vacuum chuck may be used. Conventional vacuum chucks, however, typically are not adapted to provide suction for such delicate devices and the lead frame must usually be clamped down peripherally. Any rigging used for this purpose must be refitted from one type and size of lead frame to another. The instant invention, however, alleviates this refitting step. Because the bottom surface of the partially patterned lead frame is solid and continuous, a conventional vacuum chuck can easily hold the lead frame in place during processing. Furthermore, one size strip of metal that can accommodate the various industrial lead frames can be used universally in the manufacture of the lead frames. The subsequent process steps of chip attach and wire bonding can be accomplished with much less stress and strain on the lead frame to be formed. Lead frames with much finer geometries can easily be fabricated because the leads are held together by the web-like structures and are not separated from each other until the very final step.

Forming of the various patterns on the lead frame can be accomplished in a number of ways. One approach can be stamping/coining the pattern into the metal. Other approaches may include chemical or electrochemical milling and electrical discharge machining (EDM). On the other hand, photolithographic patterning, which is a mainstay of semiconductor manufacturing, is preferred. In the present invention, metal strip (100) shown in FIG. 4 is pre-plated on both the front (or top) side and the back (or bottom) side prior to the photolithographic patterning. Either or both the front surface and the back surface may be pre-plated with a material that enables bonding as well as solderability, respectively. In one embodiment, the front surface is pre-plated with a bondable material, such as Ni/Pd/Au-strike or Ag. In another embodiment, the back surface is pre-plated with a solderable material, such as Sn/Pb, lead-free solder, immersion-tin electroless-nickel or Au-strike. In another embodiment, the back surface is pre-plated with the same material as the top side, which can then act as a resist during back-patterning. This resist-like plating can later be stripped prior to final finishing. The pre-plating can be performed at a later step, if so desired.

Figure 5:
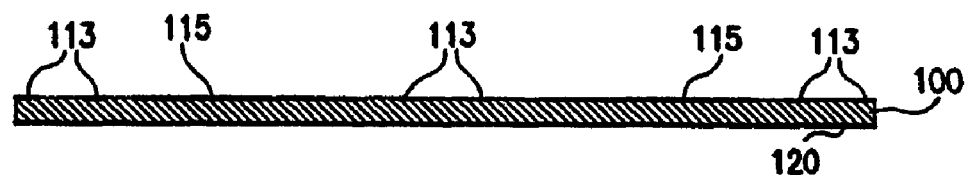
FIG. 5 is a cross-sectional view of a metal film of FIG. 4, where only the pre-plating on the top surface has been patterned corresponding to two chip sites with each site including a chip-pad and lead contacts surrounding each chip-pad, according to the present invention.

At the next step, the pre-plated front side (110) is photolithographically patterned to form areas corresponding to chip-pad (115) and electrical contacts (113) surrounding the chip-pad area. An electrical contact (113) can be characterized as the end portion of a lead that is connected to the chip-pad area (115) through a first region of intermediate recessed portions that forms the web-like structure. These intermediate recessed web-like portions are removed at a later time when metal film (100) is etched from the back so that the end portions and the chip-pad portions will be isolated from each other. The areas comprising a chip-pad (115) and the surrounding contacts (113) are sometimes referred to as chip sites. A plurality of chip sites can be formed on a continuous roll of copper sheet sprocketed to a spool to easily automate the forming of lead frames comprising one or more chip sites. FIG. 5 illustrates two chip sites, which will be formed into two corresponding lead frames, which in turn will be part of two packages that will be formed from them.

Figure 6:
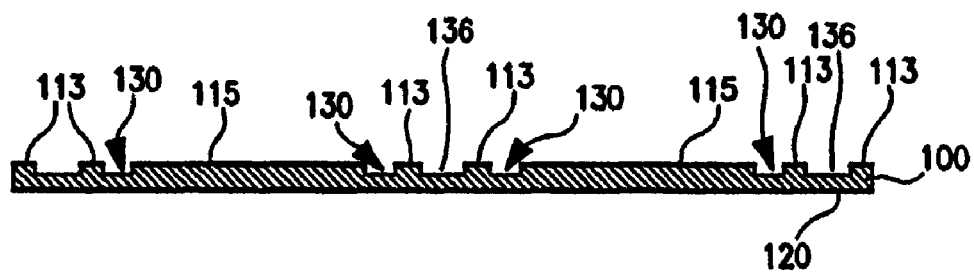
FIG. 6 is a cross-sectional view of the plated metal film of FIG. 4, which has been partially patterned, according to the present invention.

The pattern shown for the two chip sites illustrated in FIG. 5 is then transferred into film strip (100) by etching. As shown in FIG. 6, a main feature of the present invention is that the etching is performed only partially through the thickness of the metal, which is referred to herein as partial patterning. The partial patterning is performed in a first region of the film to form a webbed structure (130) that connects the chip pads (115) of lead contacts (113) of each lead frame. The first region also connects the lead frames to one another at street portions (136) of the film.

Figure 6B:
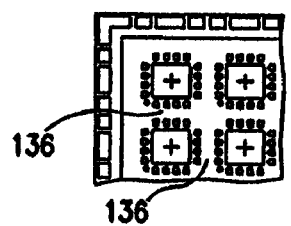
Figure 6C:
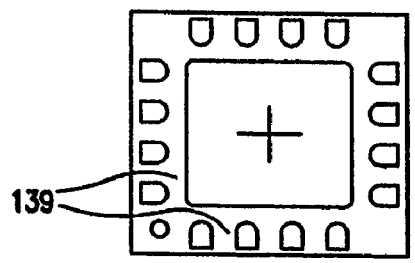
Figure 6A:
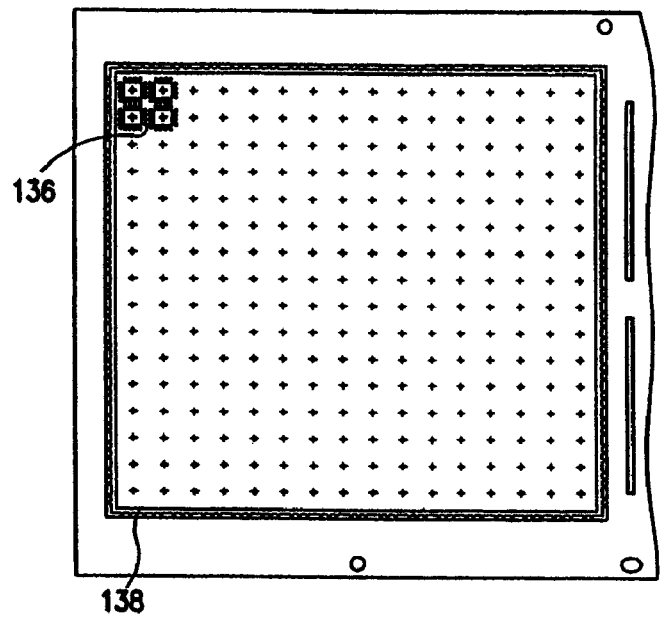
FIG. 6a is a top view showing a matrix of partially patterned lead frames according to the present invention.

As shown in FIGS. 6a-c, a matrix or such lead frames (for example, 16×16) may be formed in a block/window film (138). FIGS. 6b and 6c show that the first region includes the webbed structure (139) connecting the chip pad and lead contacts of each lead frame. The first region also connects the plurality of lead frames to one another at street portions (136) of the film.

In one embodiment, the partial patterning can vary from 25% to 90% of the thickness of the film. The partial patterning, however, may be virtually any percentage of the thickness of the film and the amount of partial etching can be determined by considering various factors affecting the manufacturability parameters, including flexibility, rigidity, and thermal thickness (or thermal conductance). The lateral dimensions of lead contact areas (113) and chip-pad areas (115) can be determined based on the degree of miniaturization desired for given chip sizes and wire bonds or other connecting media that may be used for interlevel or intralevel connections in a given package or between packages at the next level of packaging. It is especially noted that manufacturability concerns for fine features and dimensional stability of the lead frame are of lesser significance now by virtue of the web-like structure of the finger-like leads.

Figure 7A:
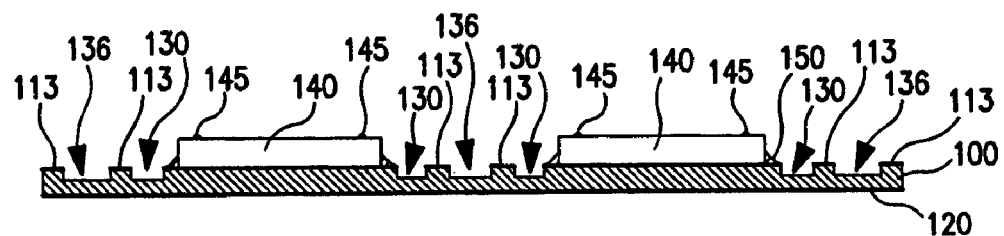
FIG. 7a is a cross-sectional view of the partially patterned metal film of FIG. 6 where a chip has been attached to the chip-pad on each of the two chip sites, according to the present invention.
Figure 7B:
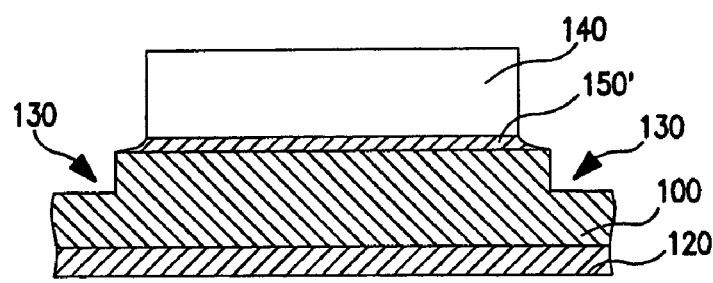
FIG. 7b is an enlarged view of the joint between the chip and the chip pad showing the attachment comprising epoxy or solder, according to the present invention.
Figure 8:
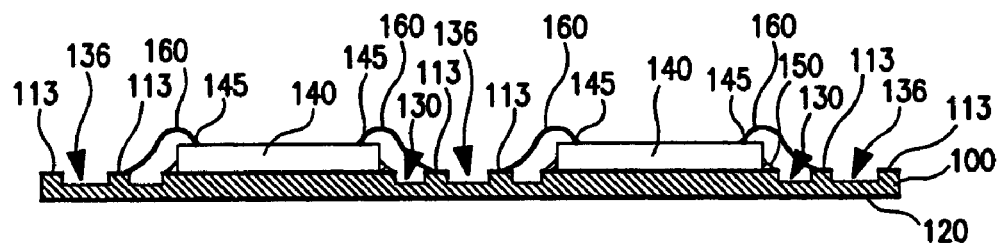
FIG. 8 is a cross-sectional view of the chip attached metal film of FIG. 7a or 7b, where the terminals on each chip have been wire bonded to the lead portions of the lead frame so formed on each chip site, according to the present invention.

As shown in FIG. 7, chips (140) are next attached to the chip-pad areas using any convenient means, such as an epoxy (150). The joint between the chip and the chip pad showing the attachment comprises of epoxy or solder, according to the present invention. Epoxy (150) may be filled with conductive particles to enhance the cooling of the chip. In the alternative, solder paste (150'), in place of epoxy (150), may also be used to provide both a stronger bond between the chip and the chip-pad, and a more effective cooling path to the ambient environment. The epoxy is cured and, as shown in FIG. 8, After chip attachment, wires (160) are bonded to terminals (145) and to corresponding lead contacts (113) using well-known wire bonding techniques, as shown in FIG. 8. Because the lead frame formed according to the present invention has a solid, continuous back side that is firmly seated and held down on a flat surface such as by a vacuum chuck (not shown), the web-like structure of the leads do not flutter or bounce during wire bonding. This results in excellent bonds, which improves the reliability of the end product.

Figure 9:
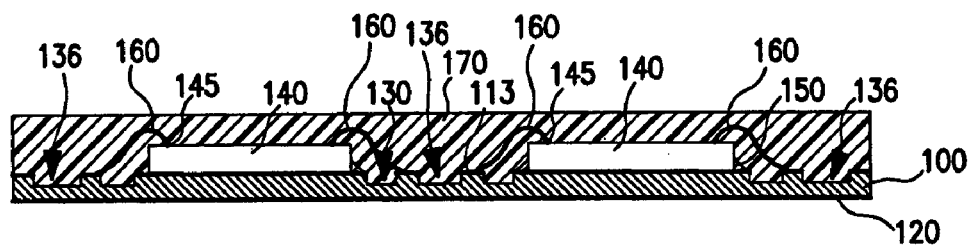
FIG. 9 is a cross-sectional view of the wire bonded lead frame of FIG. 8 where the top surface of the metal film, including the chips and the wire bonds have been hermetically sealed in an encapsulant, according to the present invention.

In FIG. 9, after connecting the chips and the corresponding contacts, all the components on the front side of the metal film are then hermetically encapsulated in a molding material, for example, by a resin. Encapsulant (170) is formed over the film and all exposed surfaces, including the lead frames and their associated wires (160), chips (140) and contacts (113) as well as the webbed structure (130) and street portions (136). When the resultant molded package is lifted up, the clean backside is now available for further processing. The commonly encountered problem of mold flashing to the footprint on the underside of the package is eliminated with this disclosed method.

Figure 10:
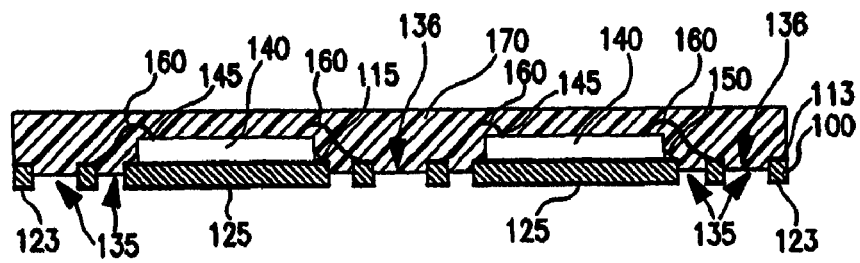
FIG. 10 is a cross-sectional view of the hermetically sealed package of FIG. 9 that has been etched from the backside to remove the first region of each lead frame and the street regions in the film, according to the present invention.

As shown in FIG. 10, both the lead contacts (113) and the chip-pads (115) can now readily be isolated from one another to form their own islands by etching the webbed structure (135) of the first region through the back side of the package. At this point, the street portions (136) are also back etched. Pre-plating (120) can be used as a mask or resist to form the desired bottom features (123, 125). The back etching continues until the molding material is reached. The etch method for back etching the metal may differ from that used for the front side. The etch time for the back side, may differ from that used for the front side, depending upon the degree of partial etching that was performed from the front side. Thus, the initial forming of the partial etch lead frame can be custom tailored to fit the manufacturing requirements for automation, quality, reliability and functionality of the final package. Pre-plating at the bottom (120) that functions as a chemical resist may be stripped to expose the metal strip (100). To protect the material and ease of mounting to the printed circuit board, solderable material such as electroless Ni/immersion Au, immersion Sn, or other such materials can be plated to the metal strip (100).

Figure 11:
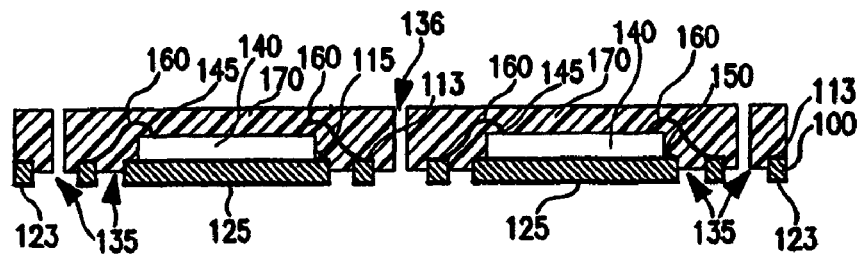
FIG. 11 is a cross-sectional view of two near chip size partially patterned packages wherein the encapsulant has been singulated in the street regions, according to the present invention to form two separate packages. These packages may be ultrasonically bonded with aluminum wires, copper wire ball bonding techniques, or with any other convenient bonding technique.

As a final step, the encapsulant (170) over the street portions (136) between the lead frames is singulated to form two individual packages as shown in FIG. 11. This is accomplished in a number of ways, including saw slicing, water-jet-cut, laser-cut, or a combination thereof, or other techniques that are especially suitable for cutting plastics. In other words, there is no more metal to cut through and hence no delamination and other problems associated with cutting plastic and metal in combination. This is to be compared with conventional packages, where bridging metal between streets must be cut at the same time that the package is being singulated. Many times, when cutting both metal and plastic at the same time, some of the metal chips can short lines and contacts, causing unwanted and unpredictable wear on the saw blades. As shown in FIG. 6a, this method may also be applied to produce a great number of packages from a matrix of lead frames.

Figure 12A:
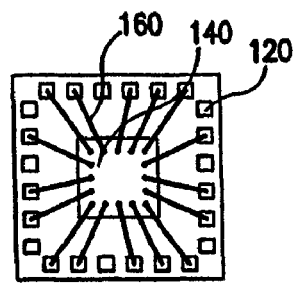
FIG. 12a is a top view of one of the singulated packages of FIG. 11 showing the chip, the contacts and the wires connecting the chip terminals to the lead contacts, and an enlarged cross section of one of the contacts with a wire bond, according to the present invention.
Figure 12B:
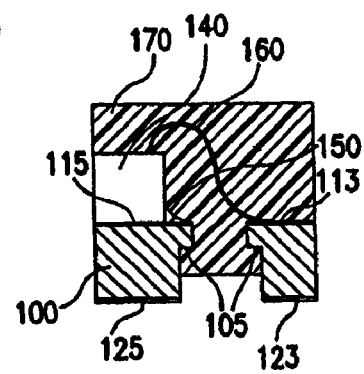
FIG. 12b is a cross-sectional view of the area between the chip-pad and one of the contacts showing the use of a "lip" on the vertical surfaces that come into contact with the molding material in order to provide anchoring and prevent delamination, according to the present invention.
Figure 12C:
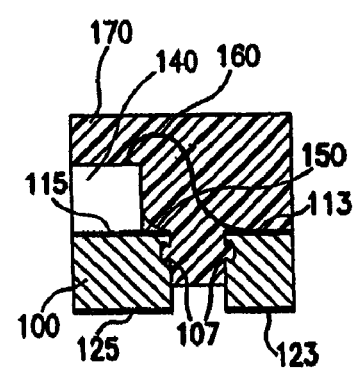
FIG. 12c is a cross-sectional view of the area between the chip-pad and one of the contacts showing the use of different shapes of cavities on the vertical surfaces that come into contact with the molding material in order to provide anchoring and prevent delamination, according to the present invention.
Figure 13A:
FIGS. 13a-13f are diagrams of various cavities that can be used to provide anchoring means for molding material on the vertical surfaces shown in FIGS. 12b and 12c, according to the present invention.
Figure 13D:
Figure 13B:
Figure 13E:
Figure 13C:
Figure 13F:

A top view of a singulated ELP is shown in FIG. 12a, where contacts (113) and chip (140) are shown isolated from one another on their own islands, but only connected with each other through wires (160) that have been wire bonded. FIG. 12b shows an enlarged view of a corner of the package between the chip and one of the contacts comprising a portion of the original metal strip (100), a top surface pre-plated to form bondable layer (113), and a bottom surface pre-plated to form solderable layer (123). In FIG. 12b, a "lip" is shown both on the contact and the corner of the chip.

The solderable pre-plated surface (120) on the underside of the package if not stripped can now be used for several purposes. First, direct external access to the back (125) of chip-pad (140) provides an additional heat path for cooling. Second, contacts (123) within the footprint of the near-chip size package (CSP) make it possible to mount tightly spaced packages at the next level of packaging, and hence increase performance for the same area.

Another aspect of the present invention provides a means for lessening the possibility of delamination between the molding material and the surfaces to which it should adhere. This is accomplished by half-etching the edges around the chip-pad and the contact areas to form a ledge or a "lip", such as referenced by numeral (105) in FIG. 12b. It is also possible to form irregularly shaped cavities (107) shown in FIG. 12c to enhance the interlocking mechanism of the surfaces that come into contact with the molding material. Enlarged views of various other cavities are also shown in FIGS. 13a-13f, and forming of these surface enhancements can readily be incorporated into the partial etching from the front side. This will not be necessary for etching from the backside inasmuch as the molding material encapsulates only the surfaces that are formed partially from the front side.

Figure 14:
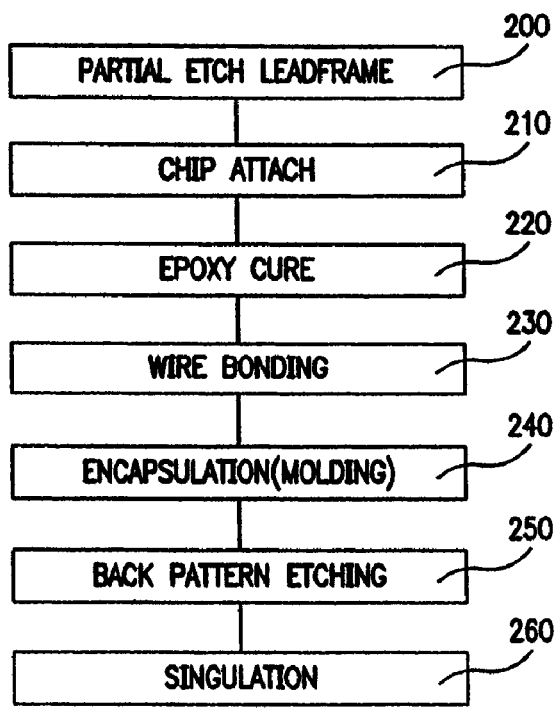
FIG. 14 is a flow chart summarizing the various process steps of forming a partially patterned package, according to the present invention.

FIG. 14 summarizes the method of the present invention as commencing with the partial etching of a lead frame (200) into a metal strip from the front side and ending with the back pattern etching (250) of the same metal strip in such a way so as to form the desired chip-pad and the surrounding contacts. The intermediate steps of chip attach (210), epoxy cure (220), wire bonding (230), and encapsulation (240) are all accomplished on a mechanically and thermally stable lead frame, because the leads are still connected through the first region of intermediate recessed portions on a partially etched web-like or webbed structure in the metal film. It is also important to note that it is only after all the components of the package have been secured in an encapsulant that the first region of intermediate recessed portions is removed through back pattern etching (250), and the peripheral contacts as well as the chip-pad are made to separate from each other for proper isolation. Prior to the final step, stripping the pre-plating (120) and applying solderable material can be performed. Consequently, there is no need to cut through any metal during singulation (260) into single near chip-size packages.

Figure 15A:
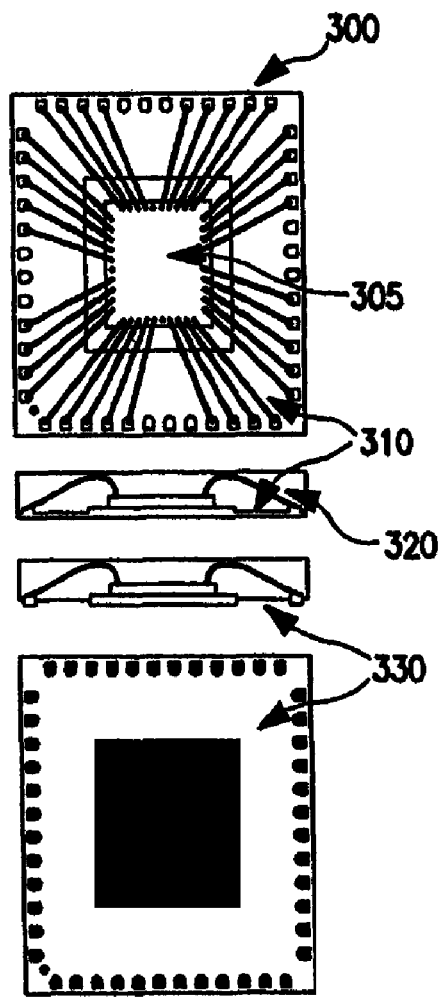
FIG. 15a is a diagram showing the top, side and bottom views of a package with a peripheral I/O configuration, according to the present invention.
Figure 15B:
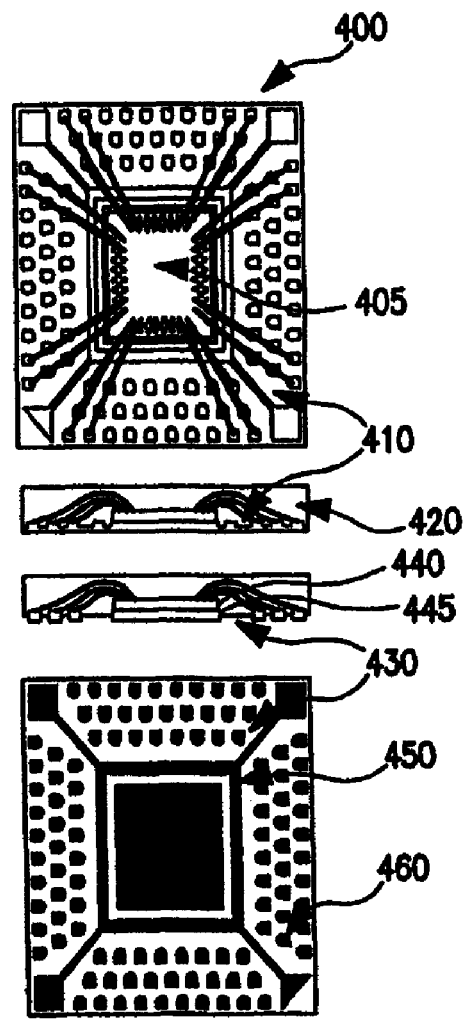
FIG. 15b is a diagram showing the top, side and bottom views of a package with an array configuration of I/O pads, according to the present invention.

The method of the present invention may be used to form a wide variety of packages, such as an array type of a lead frame for an electronic package. A top view of an array type package (400) is shown in FIG. 15b next to the standard peripheral type package (300) shown in FIG. 15a. While numeral (305) references a peripheral arrangement of chip terminals, numeral (405) references an array type arrangement of the terminals, which can be configured in-line or staggered. Both packages are formed using the disclosed partial patterning invention as indicated by reference numerals (310) and (410). In the array type ELP, inner leads (440) and outer leads (445) are shown. Both packages are encapsulated in molding material (320) or (420). Back pattern etching to isolate the contacts and the chip are indicated by (330) and (430). Numeral (450) depicts a ground ring feature, which is etched to the same level as the mold. Numeral (460) points to the array type input/output configuration on the bottom view of the ELP.

The second embodiment shown in the drawings 16-24b discloses a method of forming a partially patterned VFQFP-N type lead frame, which is especially suitable for mass producing FC electronic packages. The lead frame made to accommodate the flip-chip will, hereafter, is referred to as FCL to distinguish it from conventional lead frames. This is because, unlike conventional lead frames, FCLs are sturdier and much more adaptable to automated manufacturing lines, as described below.

FCLs are also web-like structures in contrast to the conventional all-purpose punched through, stencil-like lead frames. The front side of a web-like FCL has recessed sections, including partially patterned leads, while the back side is solid and flat. This provides mechanical rigidity to perform without distortion or deformation during the manufacturing processes. After the completion of the chip attach and hermetic sealing of the package, the backside is etched to isolate the lead contacts from each other. Removing the pre-plating, or re-plating with other solderable material, can be accomplished by electroless or immersion processes. Subsequently, the resultant encapsulated package is singulated without having to cut into any additional metal. Thus, it will be apparent that FCLs with much finer geometries, such as with VFQFP-N packages, can easily be fabricated inasmuch as the leads are held together by the web-like, or webbed structures and not totally separated from each other until the very final step of singulation.

Figure 16:
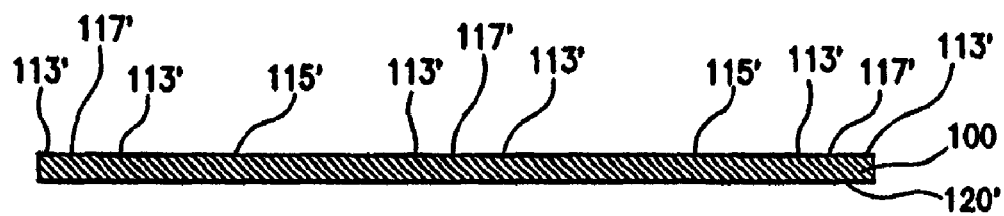
FIG. 16 is a cross-sectional view of a metal film of FIG. 4, where only the pre-plating on the top surface has been patterned corresponding to two flip-chip sites with each site including a chip receiving area and leads surrounding each chip receiving area, according to the present invention.
Figure 17:
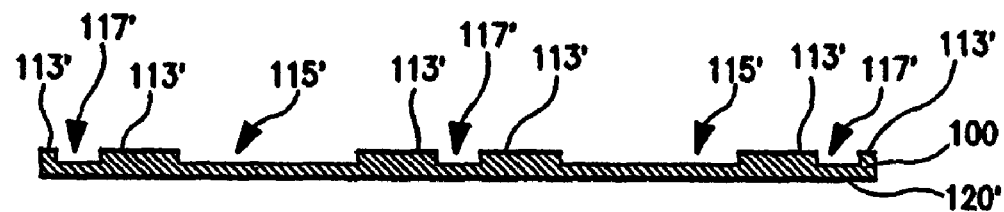
FIG. 17 is a cross-sectional view of the plated metal film of FIG. 16, which has been partially patterned to form a web-like lead frame (i.e., webbed structure), according to the present invention.

Like the already disclosed partially patterned lead frame of the first embodiment, the FCL of the second embodiment is also formed from a sheet of metal, preferably copper film as shown in FIG. 4, where both the front surface and the back surface are pre-plated, or, as stated previously, the plating can be deferred to a later step. (It is noted that, as the process steps for both embodiments are similar, the reference numerals have been kept the same as appropriate except for denoting those of the second embodiment with primes. The same reference numeral (100) has been kept for consistency for the metal film used for both embodiments). Then, the pre-plated front side (110') is photolithographically patterned to form chip receiving areas (115'), lead portions (113') surrounding the chip receiving areas, and other intermediate areas (117'). At a subsequent process step that is disclosed below, one end portion of the leads will be connected to the terminals of a PC, while the other end portion will be connected to the next level of packaging. The areas comprising a chip receiving area and the surrounding leads are sometimes referred to as a chip site, similar to the chip sites with wire-bonded chips. A plurality of lead frames comprising a plurality of chip sites can be formed on a continuous roll of copper sheet sprocketed to a spool to easily automate the forming of lead frames comprising one or more chip sites. FIG. 16 illustrates two chip sites, which will be formed into two corresponding lead frames, which in turn will be part of two packages that will be formed from them.

The pattern shown for the two chip sites illustrated in FIG. 16 is then transferred into metal film (100) by partial patterning through etching. The partial patterning shown in FIG. 17 may be up to one-half, one-quarter, or for that matter, any ratio of the thickness of the strip of metal, and the amount of partial etching can be determined by considering various factors affecting the manufacturability parameters including flexibility, rigidity, and thermal thickness (or thermal conductance). The lateral dimensions of lead contact areas (113') and chip areas (115') can be determined based on the degree of miniaturization desired for given chip sites including the chip size and the leads that may be used for interlevel or intralevel connections in a given package or between packages at the next level of packaging. It is especially noted that manufacturability concerns for fine features and dimensional stability of the lead frame are of lesser significance now by virtue of the webbed structure of the finger-like leads.

Figure 18:
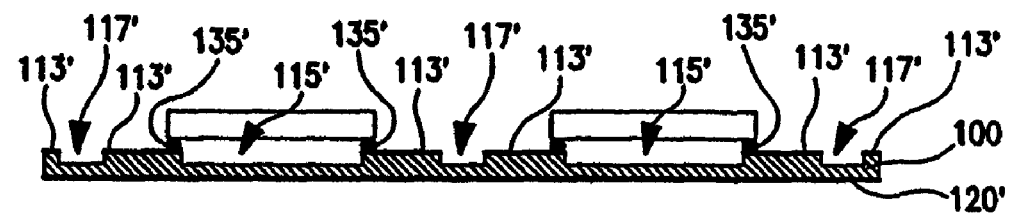
FIG. 18 is a cross-sectional view of a chip-joined lead frame (FCL) showing the flip-chip (FC) joining, according to the present invention.

Flip-chip (FC) (130') is then flipped over so that terminals (135') on the front side of the chip rest on one end portion of the leads as shown in FIG. 18. At a later step, the opposite end of the leads will be formed into electrical contacts for connection to the next level of packaging, such as a card or a board. First, however, chips assembled on the web-like lead frame structure shown in FIG. 18 are sent through a chip joining furnace as is practiced in the art. The solder balls are reflowed so that the reflow is limited by the BLM, thus forming solder pillars. Since the lead frame formed according to the present invention has a solid, continuous back side that is firmly seated and held down on a flat surface, the web-like structure of the leads do not flutter or bounce around in the chip-joining furnace, thereby yielding excellent chip joining. Consequently, the disclosed method improves the reliability of the end product, namely, that of the VFQFP-N type packages.

Figure 19:
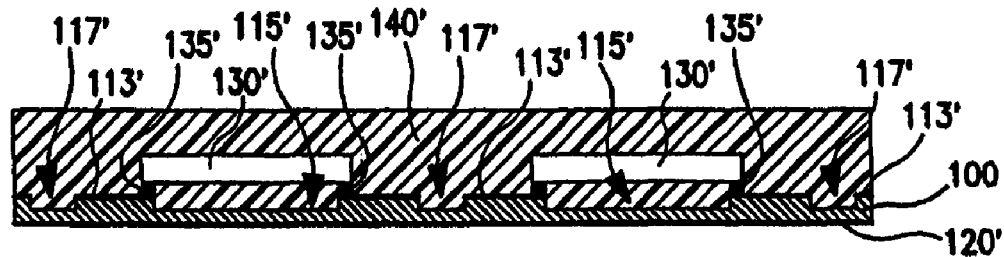
FIG. 19 is a cross-sectional view of the FCL of FIG. 18 where the top surface of the metal film, including the chips, has been hermetically sealed in an encapsulant, according to the present invention.

After chip joining, the chips, along with the partially patterned leads on the front side of the original metal film, are then hermetically encapsulated in a molding material, for example, by a resin, as shown in FIG. 19. Encapsulant (140') is formed around all exposed surfaces, including that of leads (113'), around solder balls (135'), underneath the chips, along the vertical walls of recessed chip receiving areas, (115') as well as that of the vertical walls of recessed areas (117') except for the unetched, solid and flat back side of strip of metal (100) that is held down firmly onto a flat surface. When the resultant molded package is lifted up, the clean backside is now available for further processing. The commonly encountered problem of mold flashing to the footprint on the underside of the package is eliminated in this embodiment as well.

Figure 20:
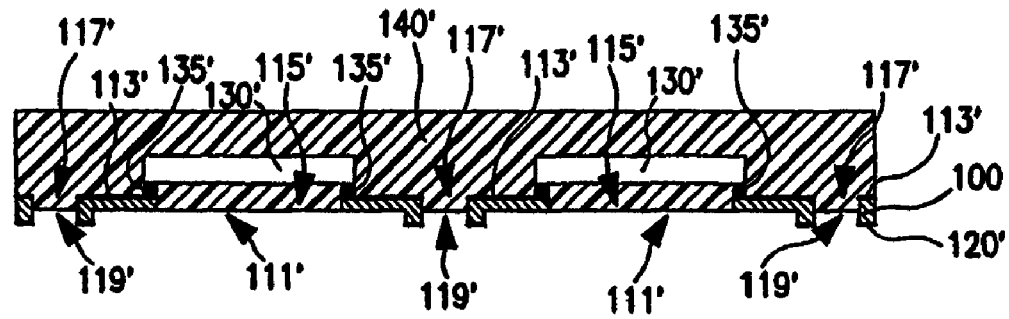
FIG. 20 is a cross-sectional view of the hermetically sealed package of FIG. 19 that has been etched from the backside to remove selectively the webbed portions between the individual leads and between the recessed chip receiving areas, according to the present invention.

Leads (113') can now readily be isolated from one another by patterning through the back side of the package in alignment with the pattern that was partially etched from the front side at the beginning of the process. The back etching continues until the molding material is reached. This is shown in FIG. 20 where web-like portions of the lead frames, namely areas (111') and (119'), are removed to disconnect chip areas (115') from each other, and leads (113') from each other. The etch recipe for back patterning the metal may or may not be the same as the recipe that was used for partial etching from the front side. Also, the etch time from the back side may differ from that used for the front side depending upon the degree of partial etching that was performed from the front side. Thus, the initial forming of the partial etch lead frame can be custom tailored to fit the manufacturing requirements for automation, quality, reliability and functionality of the final package. Pre-plating at the bottom (120) that functioned as a chemical resist may be stripped to expose the metal strip (100). To protect the material and ease mounting to the printed circuit board, solderable material such as electroless Ni/immersion Au, immersion Sn, or other material can be plated to the metal strip (100).

Figure 21:
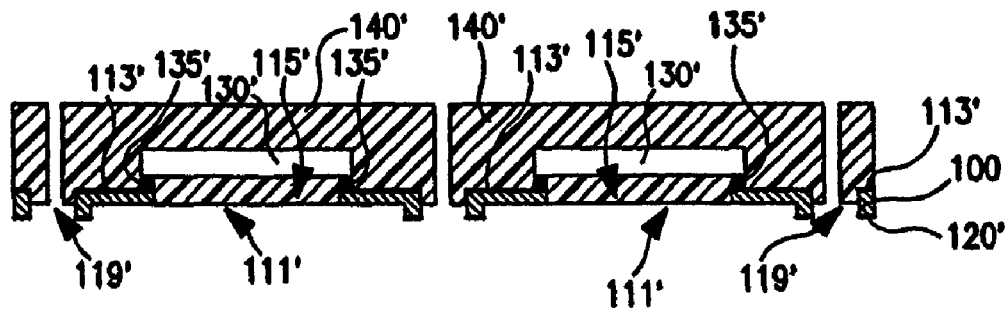
FIG. 21 is a cross-sectional view of two near chip size partially patterned packages that have been singulated from the package of FIG. 20, according to the present invention.
Figure 22A:
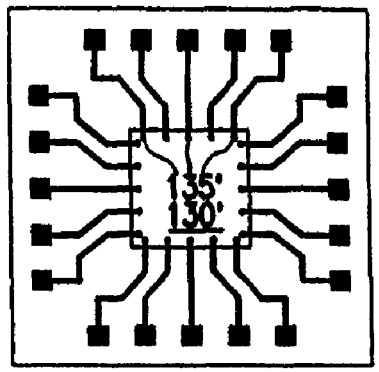
FIG. 22a is a top view of one of the singulated packages of FIG. 21 showing the chip and the leads connecting the chip terminals to the end portions of the leads, which are in turn connected to the next level of packaging, according to the present invention.
Figure 22B:
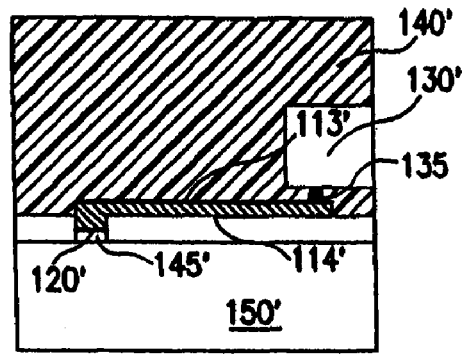
FIG. 22b is an enlarged cross-sectional view of the area between the flip chip and the connection to the next level packaging showing the two end connections of a lead, according to the present invention.

As a final step, the package of FIG. 20, having two encapsulated chip sites for the purposes of illustrating the present invention, is next singulated into singular near-chip size packages (CSPs), which are more of the VFQFP-N type packages, as shown in FIG. 21. A top view of a singulated partially patterned lead frame package is shown in FIG. 22a, where leads (113') are shown isolated from one another and connected to solder balls (135') on the underside of chip (130'). FIG. 22b shows an enlarged view of a corner of the package between the chip and one of the leads connected to an external contact (145') that may be provided on a card or a board (150'). The pre-plated surface (120') is already prepared to be joined to the next level of contact as shown in the same Figure. Also, the underside (114') of leads (113') is exposed to the ambient environment, thus providing enhanced cooling. In some cases, a coating can be applied to the underside (114) to reduce the chances for potential shortening during board mounting, especially for fine pitch applications.

The same techniques as disclosed before may be used to prevent the delamination of the encapsulant from the surfaces of the FCL, namely, by incorporating the irregularly shaped cavities of FIGS. 13a-13f on the vertical walls of the recessed areas (115') and (117') of the webbed lead frame. The forming of these surface enhancements can readily be incorporated into the partial etching from the front side. This will not be necessary for etching from the backside inasmuch as the molding material encapsulates only the surfaces that are formed partially from the front side.

Figure 23:
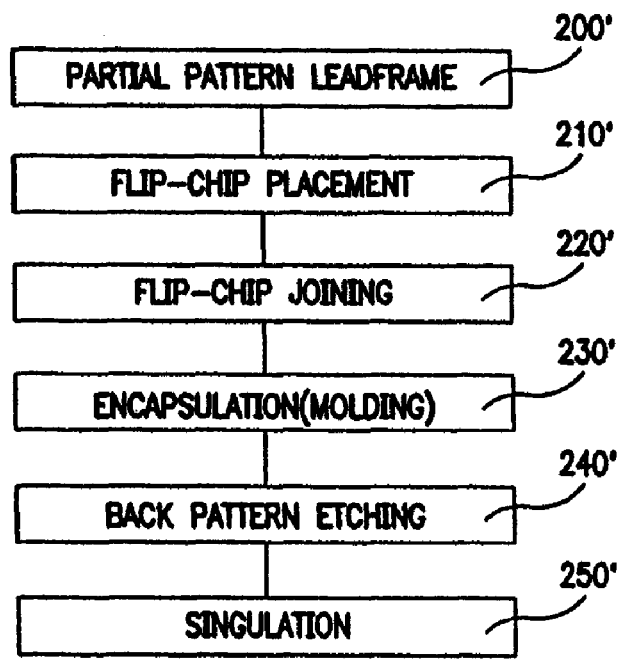
FIG. 23 is a flow chart summarizing the various process steps of forming a partially patterned package supporting a flip-chip, according to the present invention.

FIG. 23 summarizes the method of the present embodiment as commencing with the partial patterning of a lead frame (200') into a metal strip from the front side and ending with the back patterning (240') of the same metal strip in such a way so as to form the desired chip receiving areas and the surrounding leads. The intermediate steps of FC placement (210'), FC chip joining (220'), and encapsulation (230') are all accomplished on a mechanically and thermally stable FCL because the leads are still connected through the partially etched web-like structure in the metal film. It is also important to note that it is only after all the components of the package have been secured in an encapsulant that the web portions of the leads are removed selectively through back pattern etching (240'), and the leads are made to separate from each other for proper isolation. Consequently, there is no need to cut through any metal during singulation (250') into single near chip-size package.

Figure 24A:
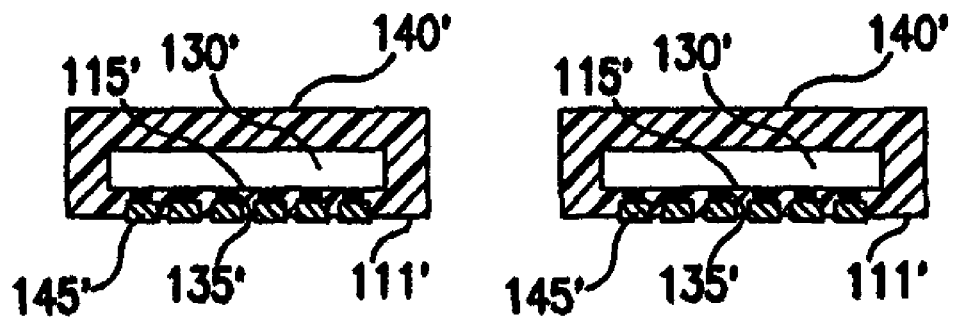
FIGS. 24a and 24b show a cross-sectional view and a bottom view of two near chip size partially patterned packages that have been singulated, and then provided with ball grid array connectors for connection to the next level of packaging to form an ELGA-type package, according to the present invention.
Figure 24B:
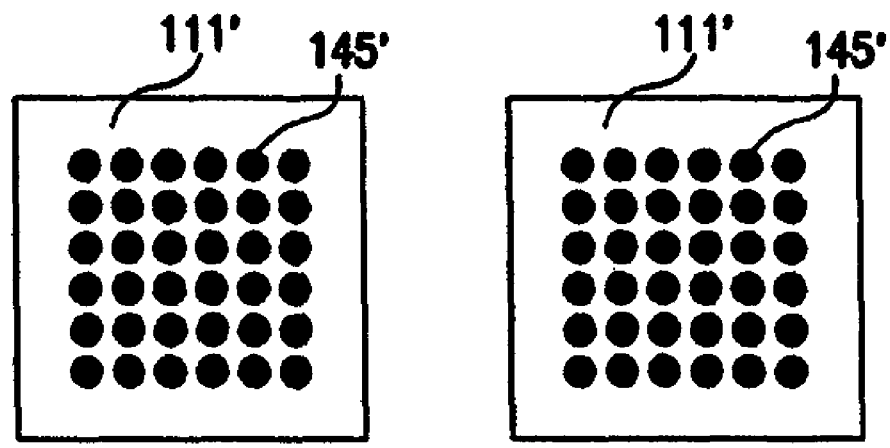

The method of the invention may be used to form a wide variety of packages, such as an array type of a partially patterned lead frame where an area array of solder bumps can be chip joined simultaneously on to the lead frame with the chip flipped over, similar to the method disclosed herein with a peripheral set of solder bumps. Also, an array of partially patterned lead frames themselves can be formed simultaneously, and then FC joined also simultaneously, followed by singulation of the array into a multiplicity of separate VFQFP-N type packages. Also, each resulting CSP can then be provided with solder bumps, pads, or other electrical connections underneath the package for array type joining on to the next level of packaging to form an etched lead frame package with ball grid array, or ELGA-type package shown in FIGS. 24a and 24b. In FIG. 24a, a cross-sectional view is shown where chip pads (135') are formed over the leads (145'). Subsequent to the back-patterning, leads (145') are electrically isolated from each other to be joined to the next level of packaging. The exposed bottom surfaces of (145') can be flash finished with any number of solderable materials through immersion-tin dipping or electroless-nickel plating. The bottom surface (111') of the ELGA package is shown in FIG. 24b with an array pattern for the electrical connections (145').

Figure 25A:
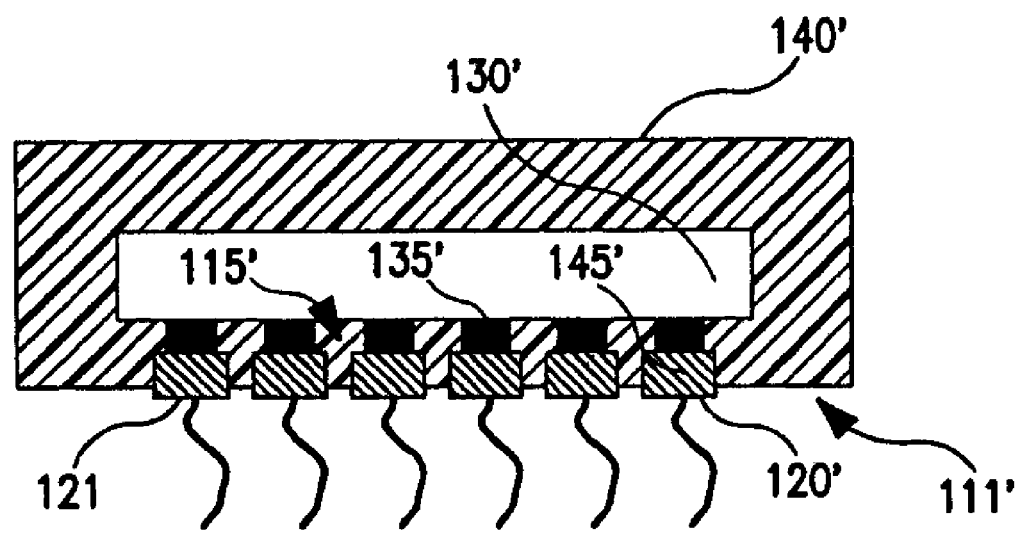
FIGS. 25a and 25b show another embodiment of the present invention where packages of FIGS. 24a and 24b are ultrasonically bonded with aluminum wires, and alternatively with copper wire ball bonding techniques, respectively, according to the present invention. The copper wire ball bonding techniques are commonly used to connect flip-chips packages to lead frames.
Figure 25B:
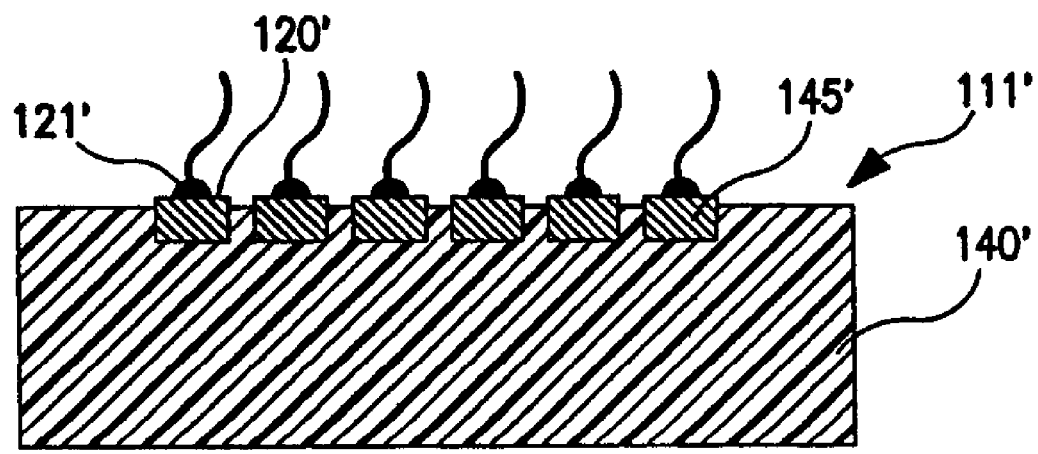

Because the partial etching method of forming any one of the ELP, ELPF or ELGA packages provides robustness during the various manufacturing steps, other forms of electronic packages are also possible. One such form comprises wire bonding of the lead frame packages of the present invention to the next level of packaging. Ultrasonic bonding techniques cannot be used on conventional lead frames because of the fragility of the leads themselves, unless they are attached to a solid base to provide stability and strength. In contrast, the partially etched lead frames are stable by virtue of their webbed structure. The un-etched and pre-plated bottom surface (120') of partially patterned lead frame provides solid bonding areas, or posts, to effectively apply ultrasonic energy for aluminum wire wedge bonding on blocks or strips of ELPs, or ELPFs. In accordance with another aspect of the present invention, therefore, aluminum wires (121) are ultrasonically attached to the bottom surface of a block or strip of partially etched lead frames as shown in FIG. 25a. The wire diameters range between about 0.001 inch to 0.020 inch, the latter diameter representing ribbons instead of wires. The strips are then encapsulated, back-patterned and singulated to form the individual near-CSPs. Ultrasonic bonding is desirable because it avoids exposure to ball bonding temperatures experienced by ball grid array type packages, and hence, improved reliability. Copper wire ball bonding may also be applied as shown in FIG. 25b. It will be understood that the CSPs shown in FIGS. 25a and 25b can be any one of ELPs and ELPFs.

The invention promotes a number of additional advantages in the manufacturing process for electronic packages. For example, after the back etching and prior to singulation, a block of packages will inherently be ready for strip testing while the packages are still arranged in the block. This provides a significant advantage as compared to handling the packages as individual units. Strip testing the packages while they are arranged in a block improves the reliability of the test.

The invention also enables a manufacturer to produce packages having dual or triple rows of staggered leads that can multiply I/O capacity of a given package. The flat continuous bottom surface of the lead frames enables the use of universal assembly equipment, which does not need refitting for each application, and which is completely flexible for automation. For example, processing between 2×2 through 12×12 package blocks does not require any mechanical change. In addition, the invention easily facilitates the construction of packages having a "stand off" for each foot (for example, at 2 mils between the bottom of the molded body at the surface of the foot). The stand off provides additional advantages when the chip packages are to be connected to the next level of packaging, such as a board.

Figure 26A:
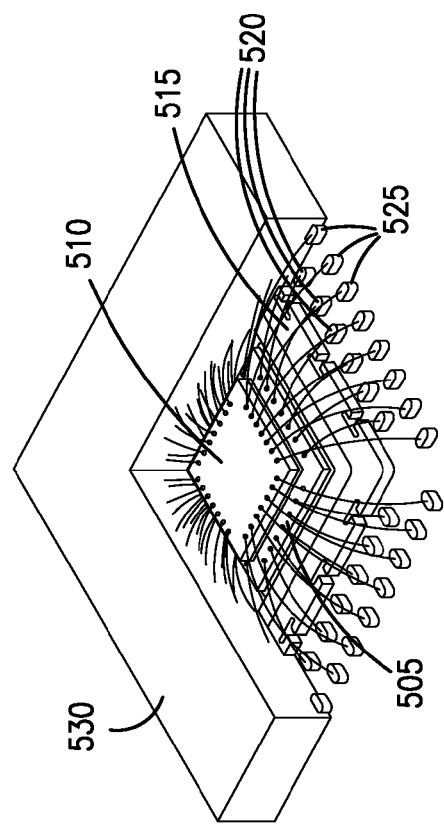
FIGS. 26a and 26b are perspective and cross-sectional views of an embodiment of the invention wherein a plurality of chips are die-stacked to form a semiconductor package.
Figure 26B:
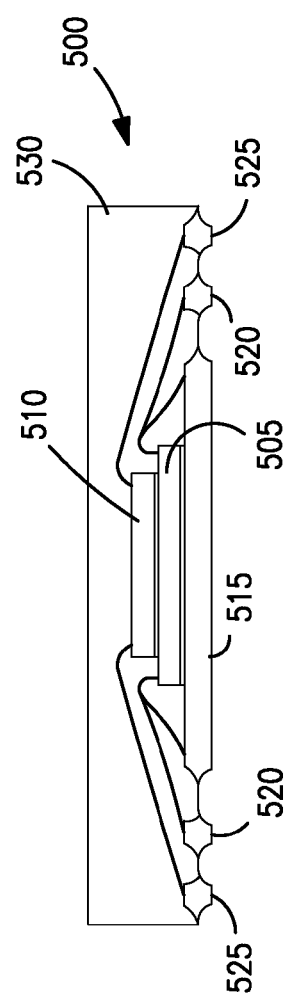

FIGS. 26a and 26b illustrate an embodiment of an aspect of the invention wherein two chips (505, 510) are die-stacked on a chip pad (515) of a lead frame (500). The lower chip (505), that is, the chip affixed to the chip pad receiving area (515), is electrically connected to the inner set (520) of electrical leads surrounding the chip pad area (515). The upper chip (510), the chip affixed to the top of the lower chip (505), is electrically connected to the outermost set (525) of leads surrounding the chip pad area (515). The chips are encapsulated with an encapsulant (530) which protects the chips and wires from damage. Although the chips (505, 510) in FIGS. 26a and 26b are wire-bonded chips, consistent with the invention, one or more of the chips may also be flip-chips. The lower die-stacked chip (505) is larger in size than the upper chip (510). Although the lower and upper chips are not electrically connected to each other in the illustration, in certain embodiments, these chips may be electrically connected, for example, by wires going from one chip to another. The step of forming electrical connections may be accomplished by connecting the terminals of the various chips to the end portions of the electrical leads which extend from the lead frame.

FIGS. 27a-27c illustrate an embodiment of the invention wherein the chip pad area (550) is recessed to allow for improved die stacking and for a reduction in the package height. In FIGS. 27a-27c, three chips (555, 560, 565) are die-stacked to form a chip package. As can be seen in FIG. 27a, the interior of the chip pad area (550) has been removed so that there is only a square outer ring. A chip (555) is placed in and attached to this chip pad area. Although three die-stacked chips (555, 560, 565) are shown in FIGS. 27a-27c, consistent with the invention, there may be any number of die-stacked chips. In FIG. 27a, the interior of the recessed chip pad area (550) is shown as being the top surface of the lead frame. That is, only the outer square ring (575) of the chip pad area has been deposited on top of the lead frame, and the entire interior (550) of the chip pad area was either not deposited or was removed from the lead frame. In alternative embodiments of the invention, a thin layer of material is deposited in the interior of the chip pad area, or a portion of the chip pad interior area is removed. In such embodiments, the interior of the chip pad area will be higher than the lead frame backing, but still lower than the outer portion of the chip pad area, thereby providing the recessed chip pad area for attachment of a chip.

Although in FIGS. 27a-27c, the largest chip (555) is located at the bottom of the die-stack, and the smallest chip (565) is located at the top, the chips may be positioned such that the largest is at the top and the smallest is on the bottom. The topmost chip (565) is shown as being connected to the middle chip (560) and to the electrical leads (580, 585) on the lead frame (570). The middle chip (560) is shown as being connected to the topmost chip (565) and to the electrical leads on the lead frame. The encapsulant (590) covering the die-stacked chips (555, 560, 565) prevents the wires of the chip package from being damaged during manipulation or installation. The various chips are attached to the lead frame (550) or each other using an adhesive, such as a conductive or a non-conductive epoxy, or using an insulating material.

FIGS. 28a and 28b are perspective views of lead frames embodying several aspects of the invention. FIG. 28a shows a lead frame (600) with four chip pad areas (605, 610, 615, 620) before chips are attached to the lead frame. FIG. 28b shows the same lead frame (600) after chips (625, 630, 635, 640) have been attached to the chip pad areas (605, 610, 615, 620) and electrically connected to the lead frame.

FIG. 28a shows the lead frame (600) as having three chip pad areas (610, 615, 620) for wire-bonded chips and one chip pad area (605) for a flip-chip. Two of the three chip pad areas (615, 620) for wire-bonded chips are not recessed and the remaining chip pad area (610) is recessed. These chip pad areas (610, 615, 620) comprise alterations (645) in the form of locking areas shaped as a "T" on the outer perimeter of the chip pad area. These locking features provide additional surface area for an encapsulant (650) to adhere, and offer a means for retaining the encapsulant without sideways movement of the encapsulant.

In FIG. 28b, the chip pads areas (615, 620) which are not recessed each support a single chip (635, 640) which is connected via electrical leads to the lead frame. The chip pad area (605) for the flip chip (625) is formed by a bed of electrical leads, and a flip-chip (625) is placed on top of these leads to form the electrical connections. The flip-chips (625) thereby save space on the lead frame (600) as compared to wire-bonded chips (630, 635, 640). Although for clarity only single chips are shown to be attached to the two non-recessed chip pad areas (615, 620) on the lead frame, in other embodiments of the invention, there may be one or more chips placed on top of such wire-bonded chips or flip-chips.

In FIG. 28b, the recessed chip pad area (610) on the lead frame supports a plurality of die-stacked wire-bonded chips (collectively 630). These chips are attached to the chip pad area (610) using an adhesive, such as a conductive or non-conductive adhesive, for example, an epoxy, or using an insulating layer. The outer periphery of the recessed chip pad area (610) comprises alterations (645) in the form of locking areas shaped as a "T".

The lead frame (600) in FIGS. 28a and 28b also has electrical leads (generally 655) located between the flip-chip chip pad area (605) and the recessed chip pad area (610) which may be used for other elements besides computer chips. For example, these electrical leads can be elements such as semiconductor elements, passive components, resistors, and capacitors, or other non-chip components [shown generically as (660)] which serve to supplement the functions of the chips in the chip package. In FIG. 28b, capacitors or resistors are attached to these electrical leads.

The chips can be die-stacked one by one on the chip pad area and then electrically connected to the lead frame before the next chip is die-stacked and electrically connected. Alternatively, all the chips can be die-stacked and then the entire die-stacked set of chips can be electrically connected to the lead frame. In another embodiment, the chips may be die-stacked separately from the chip pad area, and then the entire die-stacked set of chips may be attached and electrically connected to the lead frame.

Figures 29A, 29B, 29C:
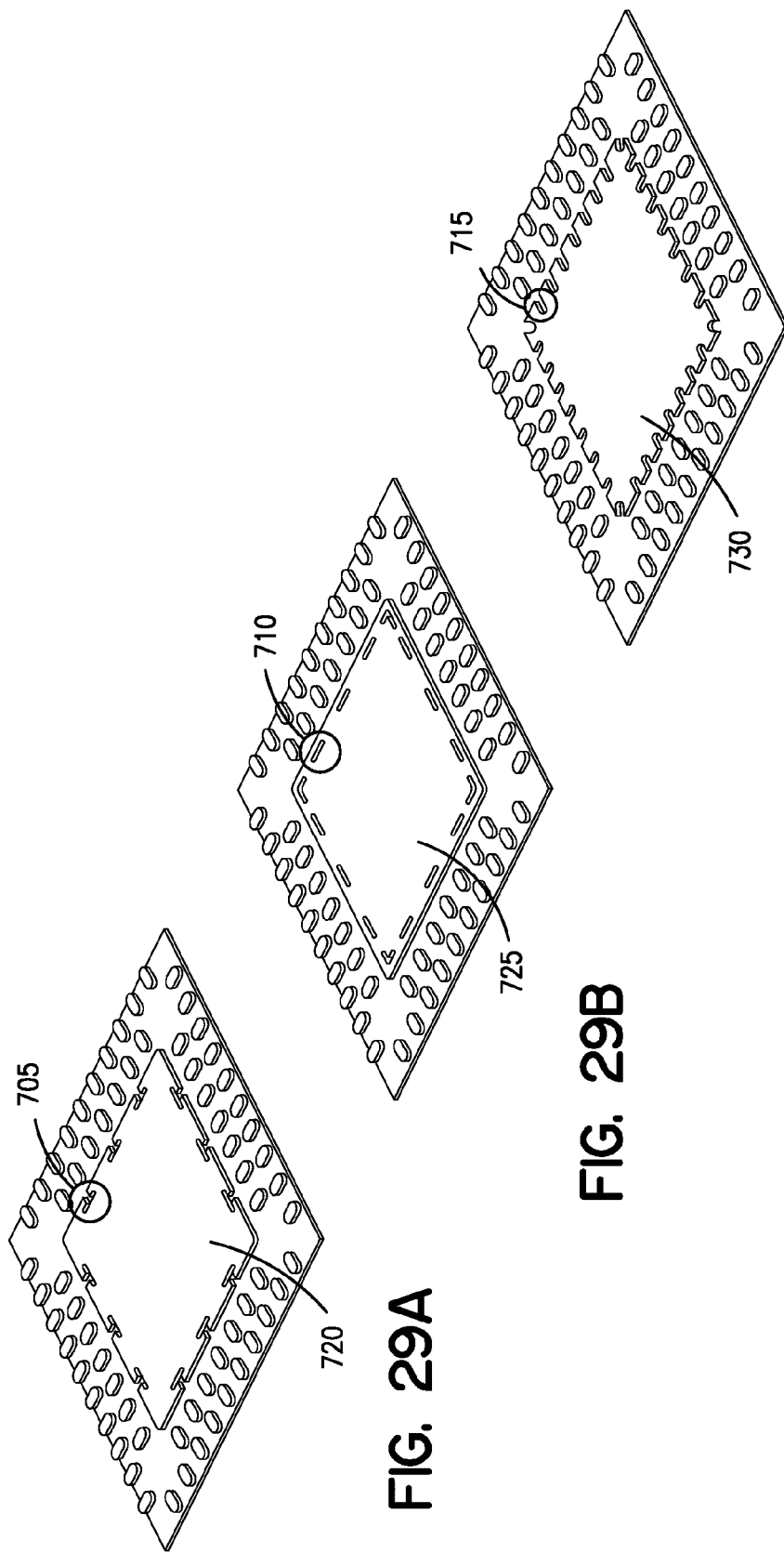
FIGS. 29a-29c show perspective views of lead frames having alterations according to an aspect of the present invention in the form of chip pad locking features.
Figure 30D:
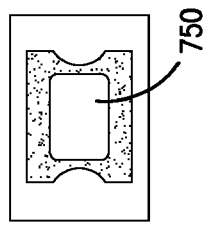
FIGS. 30a-30d illustrate top and side views of several types of electrical leads having alterations according to several embodiments of an aspect of the present invention.
Figure 30C:
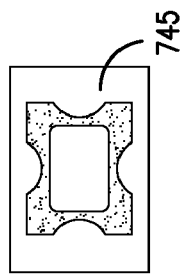
Figure 30B:
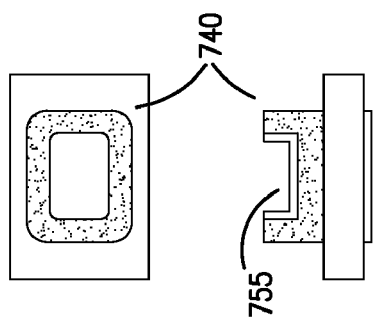
Figure 30A:
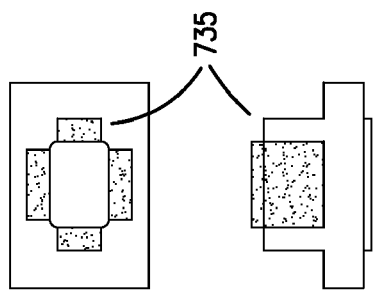

FIGS. 29a-29c show embodiments of various types of alterations which may be applied to the chip pad area. In FIG. 29a, the alterations (705) take the form of notches in the shape of a "T" on the outside edge of the chip pad area (720). In FIG. 29b, the alterations (710) are in the form of cavities or perforations located along the outer perimeter of the chip pad area (725). FIG. 29c illustrates alterations (715) in the form of notches along the outer perimeter of the chip pad area (730). These alterations provide increased strength and an improved stability to the encapsulated chip package.

Although the alterations or locking features (705, 710, 715) in FIGS. 29a-29c are located on the periphery of the respective chip pad areas (720, 725, 730), the alterations may also be placed on other portions of the chip pad area. For example, the alterations may be on interior portions of the chip pad area which will not be covered by a chip and therefore can be filled with an encapsulant.

In FIGS. 29a-29c, the alterations have been shown as being located on the chip pad area. In additional embodiments of the invention, such as those illustrated in FIGS. 30a-32f, the alterations may be located on the electrical leads located on the lead frame, and to which the chips may be electrically connected. The alterations may also be placed on both the chip pad area and the leads concurrently.

Figure 31B:
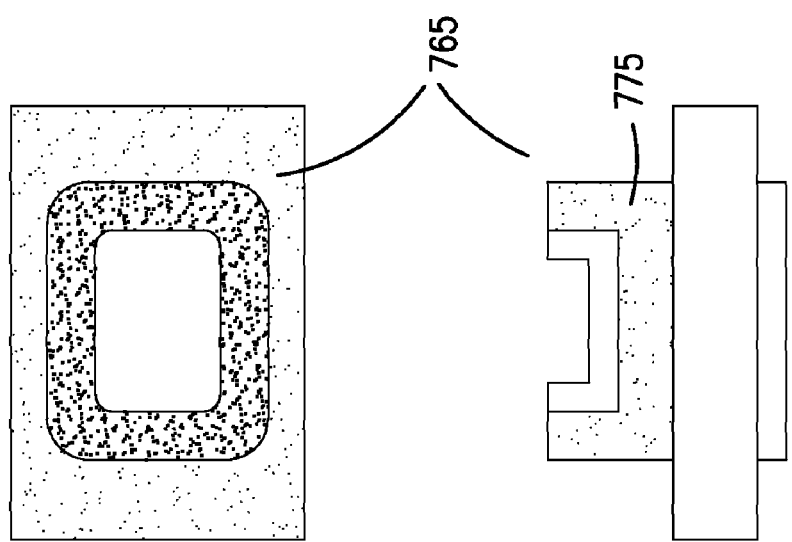
FIGS. 31a-31b illustrate top and side views of electrical leads according to another embodiment of the present invention, in which the surfaces of the lead frames or leads have been roughened.
Figure 31A:
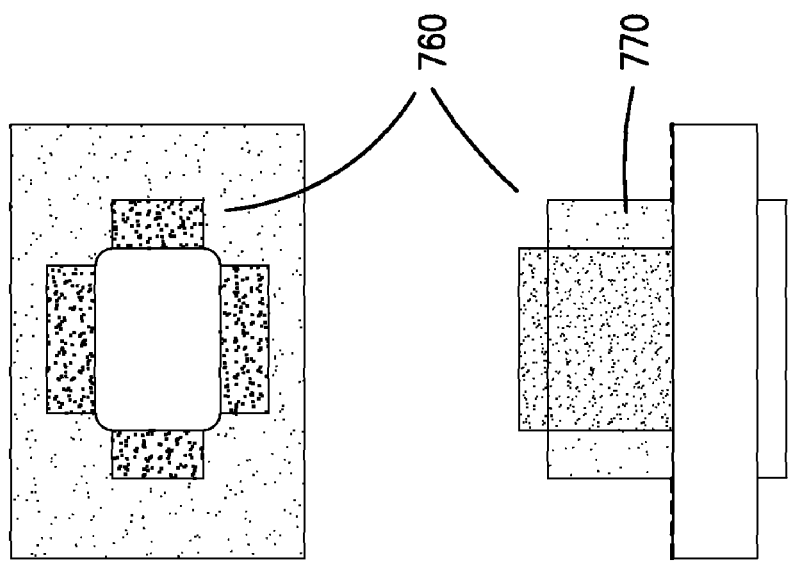

FIGS. 30a-31b show top and side view of several embodiments of electrical leads having alterations. FIGS. 30a-30d illustrate various types of leads (735, 740, 745, 750) and cross-sections of some of these leads. FIG. 30b shows that an alteration may have a bondable material located in an inner surface (755) of the lead (740). FIGS. 31a and 31b shows that the surfaces (770, 775) of the leads (760, 765) may be roughened for improved retention of an encapsulant.

Figure 32A:
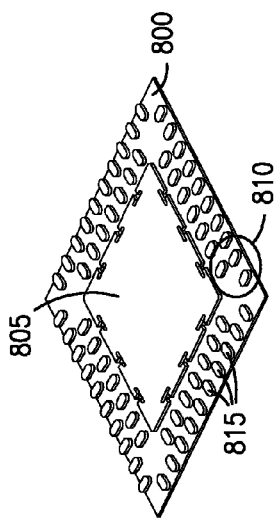
FIGS. 32a-32e illustrate perspective views of several types of alterations provided on electrical leads in accordance with another aspect of the present invention.
Figure 32D:
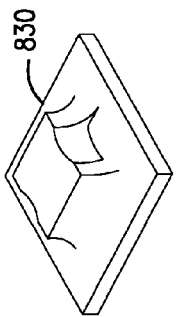
Figure 32C:
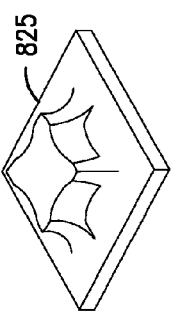
Figure 32F:
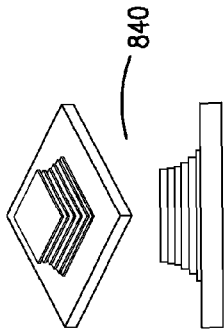
FIG. 32f illustrates top and side views of an electrical lead according to an embodiment of another aspect of the invention, in which the surfaces of the lead frames have been roughened to provide for improved adhesion of an encapsulant. This surface roughening can be done in combination with the alterations presented in the present invention.
Figure 32E:
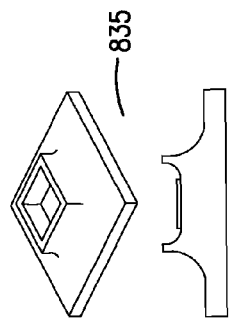
Figure 32B:
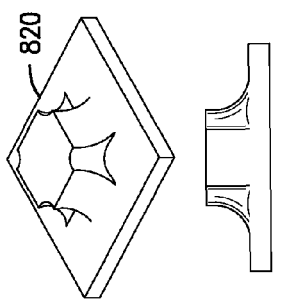

FIGS. 32a-32f illustrate perspective views of the embodiments of FIGS. 30a-31b and exemplifying several embodiments of electrical leads having alterations. FIG. 32a illustrates a lead frame (800) having a chip pad area (805). The circled portion (810) of the Figure illustrates electrical leads (815) which have alterations. FIGS. 32b-32f exemplify these types of leads. FIGS. 32b-32d show embodiments of leads (820, 825, 830) generally similar to those illustrated in FIGS. 30a, 30c, and 30d. FIG. 32e illustrates a lead (835) which is generally similar to that shown in FIG. 30b. FIG. 32f illustrates a lead (840) having surface roughening in the form of horizontal notches along the periphery of the lead, thereby giving the lead a stepped appearance. A chemical or another type of process can be used to obtain the surface roughening shown in FIG. 32f. This surface roughening can be applied in combination with the lead and chip pad alterations.

FIGS. 33a-33b illustrate cross-sectional views of an aspect of a further embodiment of the invention wherein a clip (925) is used in place of wire bonding to provide power to the chip scale package (935) and thereby improve its power capability. FIG. 33a illustrates this embodiment with the use of wire-bonded chips (905 and 910), and FIG. 33b illustrates the embodiment for flip-chips (shown as a single chip 907). The clip provides a substantially greater amount of power compared to wire bonding and consequently allows for an improved reliability of the resultant chip package (935). The clip also assists in dissipating heat from the chips. When the clip is used, the topmost chip [e.g. (910) in FIG. 33a] will contain leads for transmission of electrical signals to the ship.

In FIG. 33a, the wire-bonded chips (905 and 910) are placed on the chip pad area (900) and electrically connected to leads (915) via wires (920). A plurality of wires (920) are used to connecting the chip (910) to a plurality of rows of the electrical leads (915), although the number and type of electrical connections will depend on the specific embodiment. In FIG. 33b, a flip-chip (907) is placed on electrical leads (such as 915) which project from a lead frame. For ease of illustration, only a single flip-chip (907) is illustrated in FIG. 33b, although in practice there can be any combination of flip-chips and wire-bonded chips forming the chip scale package (935).

The top surface of the uppermost chips (907 and 910) are electrically connected one or more electrical leads (917) on the lead frame (900) by a clip (925). The clips (925) are bonded to the tops of the chips after the chips have been attached to the lead frames. Any convenient means can be used to bond the clips to the chips. In the examples illustrated in FIGS. 33a-33b, an electrically conductive paste or solder (930) is used to affix the clip (925) to the chips (907 and 910). The clips (925) can be manufactured from any conductive substance, such as a metal or a metal alloy. Examples of suitable conductive substances include copper and silver. Depending upon the specific embodiment, individual clips can be affixed to particular chips, or an entire conductive strip or panel can be affixed to a plurality of chips using a gang method. In this latter embodiment, the act of singulation cuts through the conductive strip or panel to effectively obtain the individual chip packages.

The stacked chips are subsequently covered by an encapsulant and after singulation yield chip scale packages (935) in accordance with the present invention.

While the invention has been particularly shown and described with reference to particular embodiments, those skilled in the art will understand that various changes in form and details may be made without departing from the spirit and scope of the invention.

What is claimed is:

1. A method of forming electronic packages, the method comprising the steps of:
    forming a block of partially etched lead frames having selectively pre-plated top and bottom surfaces, the lead frames comprising webbed portions, chip pad areas, and electrical lead portions, wherein the electrical lead portions are electrically separated from the chip pad areas, and the lead frames are separated from each other by street portions;
    attaching first chips to corresponding chip pad areas on the lead frames;
    die-stacking one or more second chips onto the tops of corresponding first chips;
    forming electrical connections between one or more terminals of each of the first chips and one or more electrical lead portions of the corresponding lead frame;
    forming electrical connections to the second chips;
    encapsulating the lead frames by applying an encapsulant material over the lead frames and the street portions separating the lead frames;
    back-patterning the bottom surface of the lead frames to remove the webbed portions and the street portions; and
    singulating the encapsulant material disposed over the street portions to form individual chip scale packages.

2. The method according to claim 1, wherein each of the second chips is independently the same size or a different size as the corresponding first chip.

3. The method according to claim 1, wherein the second chips are stacked onto corresponding first chips using a non-conductive epoxy or an insulating material.

4. The method according to claim 1, wherein the insulating material is a tape.

5. The method according to claim 1, wherein the second chips are stacked onto corresponding first chips using a conductive adhesive or a conductive epoxy.

6. The method according to claim 1, wherein two or more second chips are die-stacked onto the tops of one or more first chips.

7. The method according to claim 1, wherein the first chips are electrically connected to the lead frame before the second chips are die-stacked onto the first chip.

8. The method according to claim 1, wherein the first chips are electrically connected to the lead frame after the second chips are die-stacked onto the first chip.

9. The method according to claim 1, wherein the electrical connections to the second chips electrically connect the second chips to corresponding first chips, to the lead frame, or to both.

10. The method according to claim 1, wherein any of the first or second chips are independently wire-bonded chips or flip-chips.

11. The method according to claim 1, wherein the first chips are electrically connected to the lead frames using wire-bonding.

12. The method according to claim 1, wherein the chip pad area is recessed to reduce the height of the obtained package.

13. The method according to claim 1, further comprising applying alterations along the periphery of the chip pads, lead portions, or both, for improved reliability of the package during stress conditions.

14. The method according to claim 1, wherein the selective pre-plating of the bottom lead frame defines the bottom features of the lead frame.

15. The method according to claim 1, wherein the selective pre-plating pre-plates a similar pattern on the top and bottom of the lead frame.

16. The method according to claim 1, wherein the selective pre-plating is accomplished using an NiPdAu or silver alloy.

17. The method according to claim 1, wherein a back surface of one or more second chips is exposed or unexposed after encapsulation.

18. The method according to claim 1, wherein the chip scale packages comprise encapsulated flip-chips, wire-bonded chips, and combinations thereof.

19. The method according to claim 1, further comprising electrically connecting directly or indirectly to the lead frame one or one or additional more elements selected from the group consisting of passive components, isolated pads, power rings, ground rings, routings, and combinations thereof.

20. The method according to claim 1, wherein the lead frames are formed by chemical etching, stamping or coining 21. The method according to claim 1, wherein any of the chips comprise a semiconductor device.

22. The method according to claim 1, wherein the step of attaching the first chips is accomplished by back-bonding chips to chip receiving areas using an epoxy resin or solder paste.

23. The method according to claim 1, wherein the step of forming electrical connections is accomplished using wire-bonding techniques, flip-chip techniques, or a combination of both.

24. The method according to claim 1, wherein the step of forming electrical connections is accomplished by connecting the terminals on the chip to the end portions of the electrical lead portions extending from the lead frame.

25. The method according to claim 1, wherein lead portions are plated or unplated.

26. The method according to claim 1, wherein the encapsulant material is a resin.

27. The method according to claim 1, wherein back-patterning is accomplished by etching.

28. The method according to claim 1, wherein pre-plating material is removed from the bottom of the lead frames after back-pattering.

29. The method according to claim 1, wherein isolated patterns obtained on the bottom of the lead frames after back-pattering are plated with electroless Ni/immersion Au or immersion Sn, or are coated with a solderable material or an organic surface protectant (OSP).

30. The method according to claim 1, wherein singulation is accomplished by slicing the encapsulant.

31. The method according to claim 1, wherein the lead frames comprise a film of copper or a copper alloy.

32. The method according to claim 31, wherein the thickness of the film is greater than or equal to about 0.05 mm.

33. The method according to claim 1, further comprising bonding a clip to a top surface of one or more second chips to provide for improved power flow to the chip scale package.

* * * * *